(12) United States Patent
Miyata et al.

(10) Patent No.: US 7,922,865 B2
(45) Date of Patent: Apr. 12, 2011

(54) MAGNETIC FIELD GENERATOR FOR MAGNETRON PLASMA, AND PLASMA ETCHING APPARATUS AND METHOD COMPRISING THE MAGNETIC FIELD GENERATOR

(75) Inventors: Koji Miyata, Fukui (JP); Jun Hirose, Yamanashi (JP); Akira Kodashima, Miyagi (JP); Shigeki Tozawa, Yamanashi (JP); Kazuhiro Kubota, Yamanashi (JP); Yuki Chiba, Miyagi (JP)

(73) Assignees: Shin-Etsu Chemical Co., Ltd., Tokyo (JP); Tokyo Electron Limited, Tokyo (JP)

( * ) Notice: Subject to any disclaimer, the term of this patent is extended or adjusted under 35 U.S.C. 154(b) by 701 days.

(21) Appl. No.: 10/362,879

(22) PCT Filed: Aug. 28, 2001

(86) PCT No.: PCT/JP01/07355
§ 371 (c)(1),
(2), (4) Date: Jun. 20, 2003

(87) PCT Pub. No.: WO02/21585
PCT Pub. Date: Mar. 14, 2002

(65) Prior Publication Data
US 2004/0094509 A1 May 20, 2004

(30) Foreign Application Priority Data
Sep. 1, 2000 (JP) ................................. 2000-265728

(51) Int. Cl.
*H01L 21/306* (2006.01)

(52) U.S. Cl. ......... 156/345.42; 156/345.46; 156/345.49; 438/728; 438/732

(58) Field of Classification Search ............. 156/345.36, 156/345.41, 345.42, 345.46, 345.49, 345.3, 156/36, 41, 42, 46; 216/63, 71; 438/714, 438/729, 732, 728
See application file for complete search history.

(56) References Cited

U.S. PATENT DOCUMENTS

| | | | |
|---|---|---|---|
| 5,444,207 A | 8/1995 | Sekine et al. | |
| 5,519,373 A * | 5/1996 | Miyata | 335/306 |
| 5,659,176 A * | 8/1997 | Bergen et al. | 250/326 |
| 5,717,294 A * | 2/1998 | Sakai et al. | 315/111.41 |
| 6,014,943 A * | 1/2000 | Arami et al. | 118/723 E |
| 6,377,149 B1 * | 4/2002 | Miyata | 335/306 |
| 6,562,189 B1 * | 5/2003 | Quiles et al. | 156/345.43 |

FOREIGN PATENT DOCUMENTS

| | | | |
|---|---|---|---|
| EP | 0 661 728 A1 | 7/1995 | |
| EP | 0 669 637 A1 | 8/1995 | |
| EP | 0 762 471 A1 | 3/1997 | |
| JP | 06-037054 | * | 2/1994 |
| JP | 06-224027 | * | 8/1994 |

(Continued)

*Primary Examiner* — Lan Vinh
(74) *Attorney, Agent, or Firm* — Sughrue Mion, PLLC

(57) ABSTRACT

In a magnetic field generator for magnetron plasma generation which comprises a dipole-ring magnet with a plurality of columnar anisotropic segment magnets arranged in a ring-like manner, or in an etching apparatus and a method both of which utilize the magnetic field generator, the uniformity of plasma treatment over the entire surface of a wafer (workpiece) is improved by controlling the direction of the magnetic field relative to the working surface of the wafer (workpiece) which is subject to plasma treatment such as etching.

11 Claims, 33 Drawing Sheets

FOREIGN PATENT DOCUMENTS

| | | | |
|---|---|---|---|
| JP | 7-288195 A | 10/1995 | |
| JP | 09-260355 | * | 10/1997 |
| JP | 9-260355 A | 10/1997 | |
| JP | 10-041284 | * | 2/1998 |
| JP | 11-329788 A | 11/1999 | |

* cited by examiner

FIG. 13
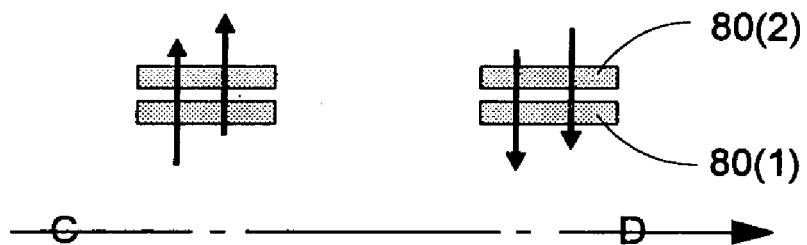
(a)
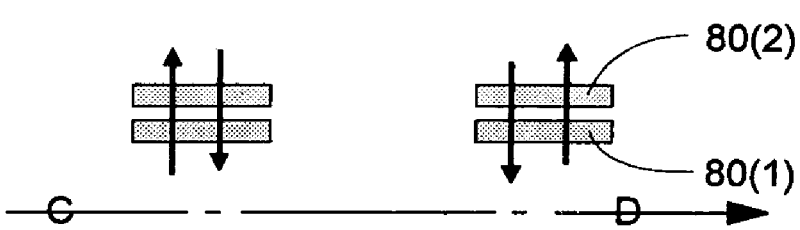
(b)
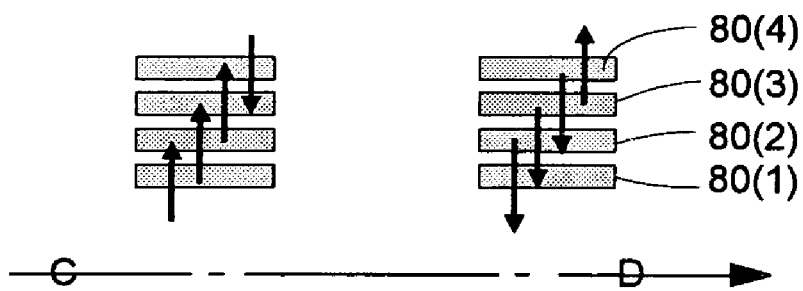
(c)

FIG. 23
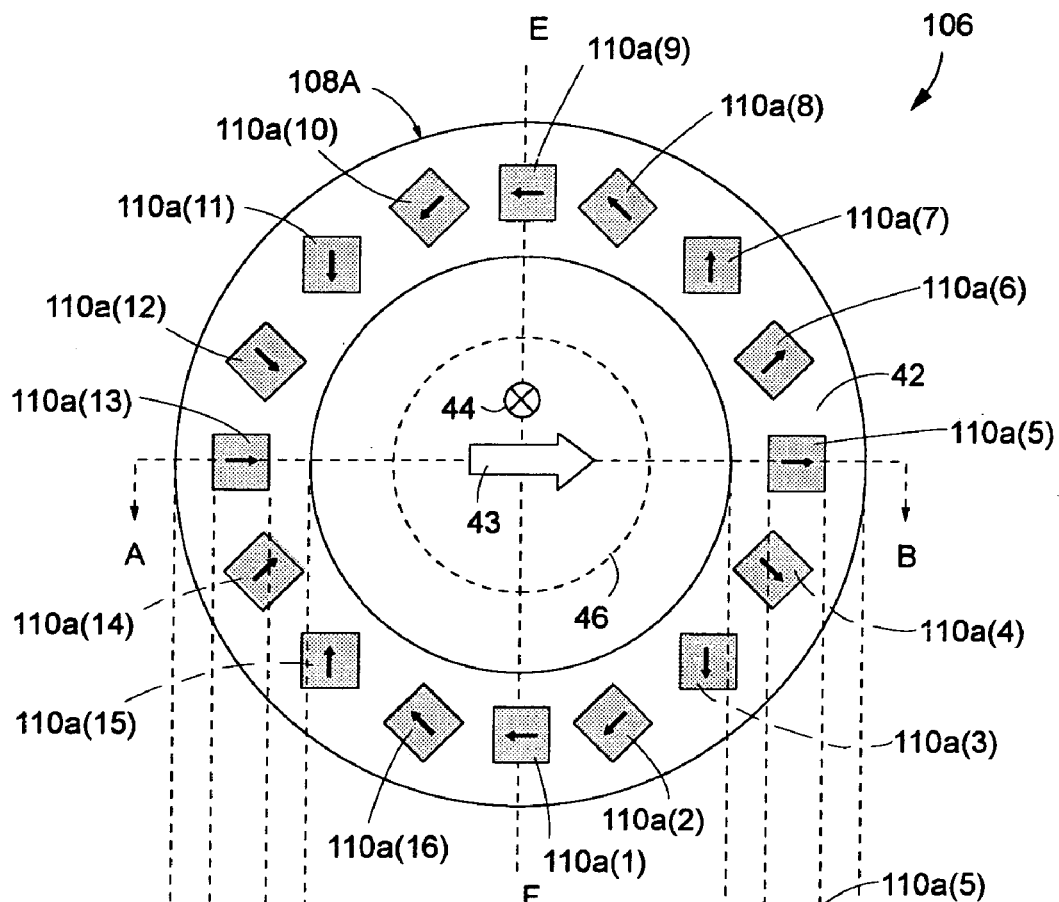
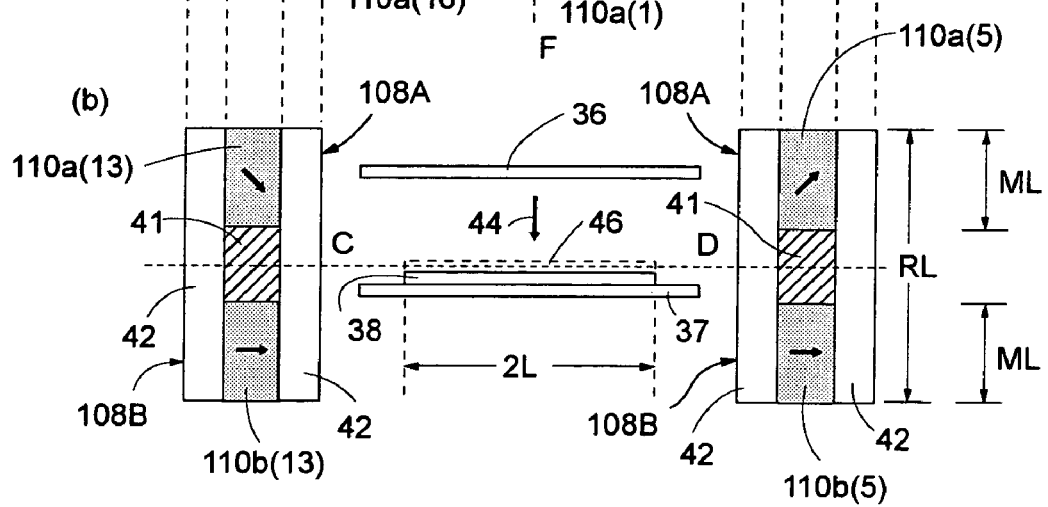

FIG. 26

|   | MAGNETIZED DIRECTION SHOWN IN FIG. 25 | MAGNETIZED DIRECTIONS OF RESPECTIVE SEGMENT MAGNETS 110a(2)-110a(8) | MAGNETIZED DIRECTIONS OF RESPECTIVE SEGMENT MAGNETS 110b(2)-110b(8) | MAGNETIC FIELD ANGLE $\theta$ AT WAFER EDGE 38a |
|---|---|---|---|---|
| A | | 45 | 45 | −18.9 |
| B | | 60 | 0 | −15.0 |
| C | | 45 | 0 | −10.3 |
| D | | 0 | 45 | − 5.6 |
| E | | 0 | 0 | 0.0 |
| F | | −45 | 0 | 5.6 |
| G | | 0 | −45 | 10.3 |
| H | | 0 | −60 | 15.0 |
| I | | −45 | −45 | 18.9 |

FIG. 28
(a) PRESENT INVENTION
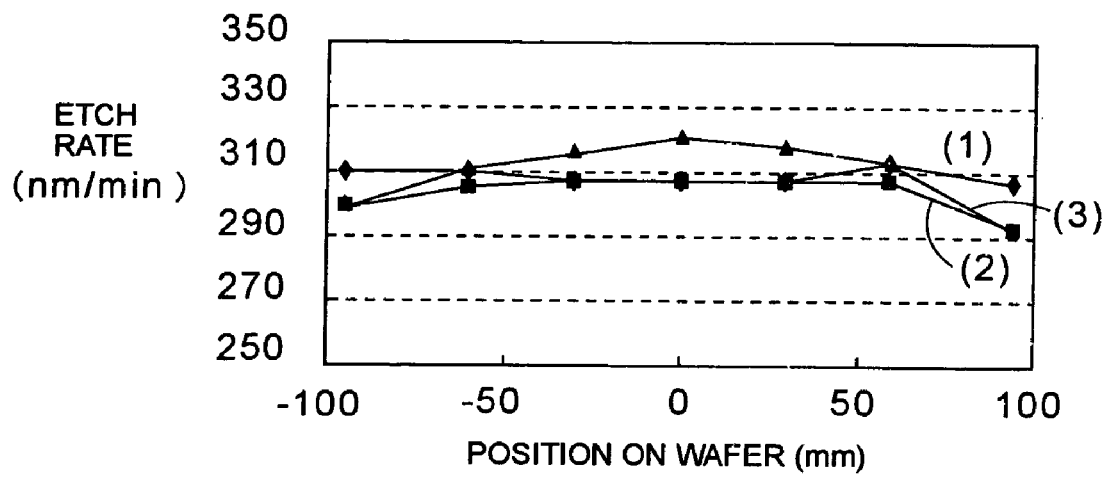
(b) EVALUATING EXAMPLE
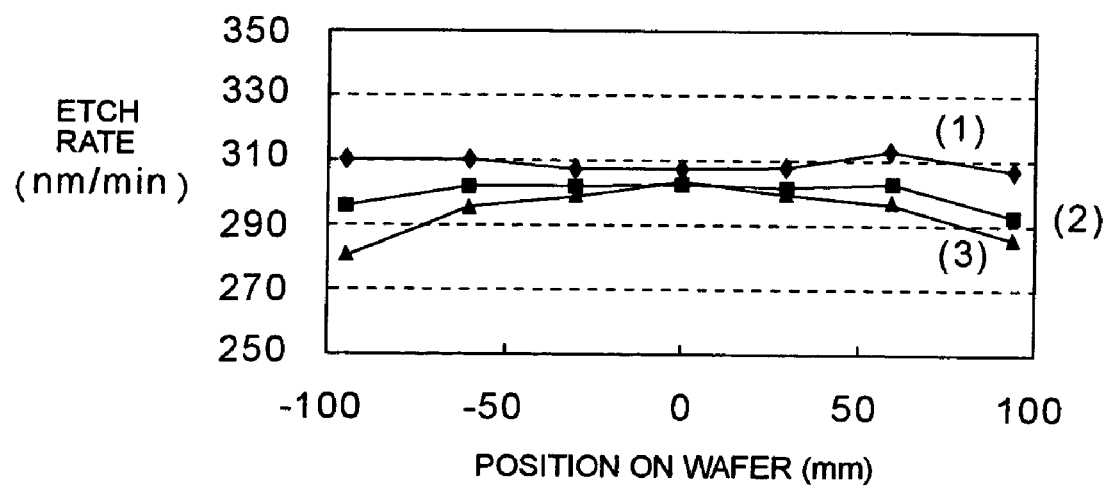

FIG. 29
(PRIOR ART)
(a)
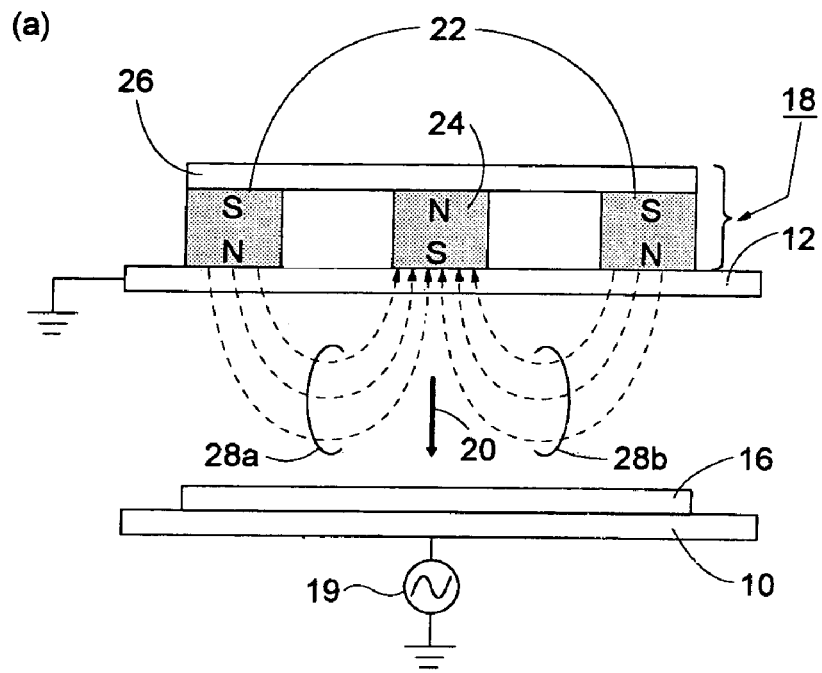
(b)
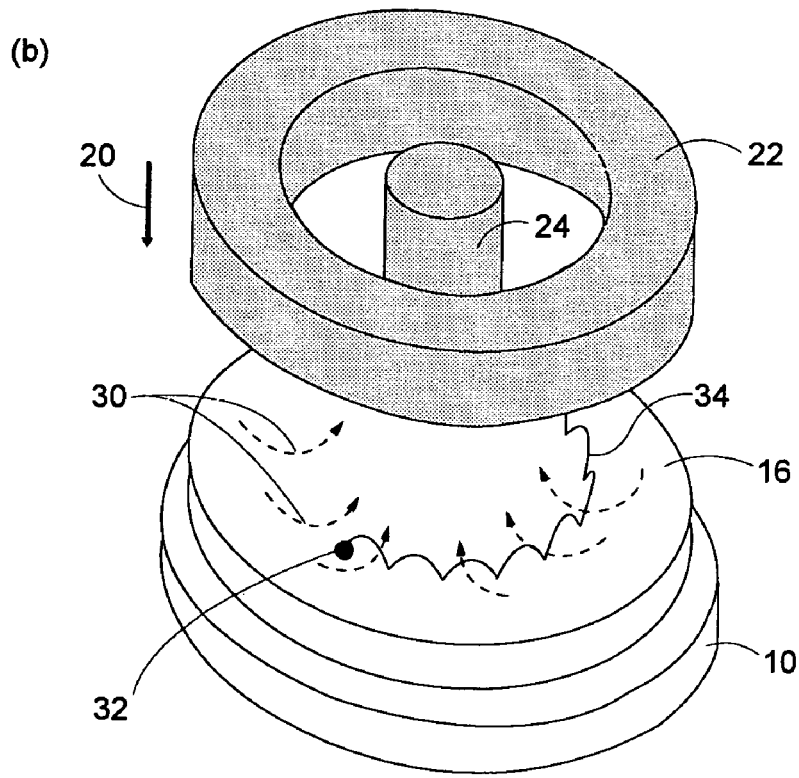

MAGNETIC FIELD GENERATOR FOR MAGNETRON PLASMA, AND PLASMA ETCHING APPARATUS AND METHOD COMPRISING THE MAGNETIC FIELD GENERATOR

TECHNICAL FIELD

The present invention relates generally to a magnetic field generator for magnetron plasma generation, and more specifically to a plasma etching apparatus and method utilizing such a magnetic field generator.

The apparatus and the method according to the present invention are well suited for use in etching implemented in production processes of electronic components such as semiconductor devices.

The present invention is further applicable to a semiconductor processing apparatus and method of plasma treatment such as sputtering.

BACKGROUND TECHNOLOGY

It is well known in the art to use magnetron plasma for etching or sputtering, which is implemented in production processes of electronic components such semiconductor devices.

Magnetron plasma is generated, as described below, using a magnetron plasma apparatus. A gas (e.g., halogen gas for etching and argon gas, etc. for sputter is introduced into a magnetron plasma apparatus, after which discharge is induced within the apparatus. Then, the electrons released due to the discharge serve to ionize the process gas within the apparatus, leading to the generation of secondary electrons. These secondary electrons collide with gas molecules with the result of promoting the ionization of the gas in the apparatus. The electrons and secondary electrons, which have been generated due to the discharge, acquire the forces generated by the magnetic and electric fields, and exhibiting drift movements.

The gas molecules are further ionized by the electrons exhibiting the drift movements, and new secondary electrons are generated due to the ionized gas molecules. Since the magnetron plasma apparatus repeats such processes and promotes gaseous ionization, it features that the ionization efficiency is very high. Therefore, the plasma generation using the magnetron plasma apparatus has the advantage that the efficiency thereof is two to three times that of a high-pressure discharge technology wherein no magnetic field is used.

One example of conventional magnetic field generator for magnetron plasma generation will be discussed with reference to FIGS. 29-32, and a conventional magnetron plasma etching apparatus will be discussed by referring to FIG. 33.

FIG. 29(a) is a schematic vertical cross sectional view of the plasma etching apparatus according to a first conventional example, and FIG. 29(b) schematically shows the motions of electrons within the apparatus of FIG. 29(a). As shown in FIG. 29(a), plate-like electrodes 10 and 12 are provided in parallel within the apparatus. A wafer (or workpiece) 16 is deposited on the electrode 10, which wafer is to be subject to etching treatment. The magnetic field generator 18 for generating magnetron plasma is provided on the plate-like electrode 12 (viz., provided at the opposite side of the other plate-like electrode 10).

The high-frequency voltage generator 19 is for generating alternating electric fields between the plate-like electrodes 10 and 12.

An arrow 20 in FIG. 29(a) indicates the direction of the electric field at the moment when the plate-like electrode 10 is negative and the plate-like electrode 12 is positive.

The conventional magnetic field generator 18 for magnetron plasma generation, which is illustrated in FIG. 29(a), comprises a ring-like permanent magnet 22, a disk-like permanent magnet 24 provided inside the ring of the magnet 22, and a yoke 26. The manner that the magnetic field generated by the magnetic field generator 18 reaches the wafer 16 by way of the electrode 12 is shown by magnetic force lines 28a and 28b. The lines of magnetic force 30 in FIG. 29(b) indicate in perspective the lines of magnetic force 28a and 28b shown in FIG. 29(a) on or above the surface of the wafer 16. As mentioned above, when the direction of the electric field is as indicated by the arrow 20, an electron 32 travels along endless track 34 while exhibiting the drift movement as shown in the drawing. Consequently, the electron(s) 32 is confined in the vicinity of the upper surface of the wafer 16, and hence the gaseous ionization is accelerated. For this reason, the apparatus shown in FIG. 29 is able to generate high-density of plasma.

However, among the magnetic force lines, those contributing to the electron drift movement are those perpendicular to the direction of electric field. That is to say, with the apparatus of FIG. 29, only the magnetic field component, which is in parallel with the surface of the wafer 16, is able to contribute to the electron drift movement.

In the magnetron etching apparatus, which uses the magnetic field generator for magnetron plasma generation according to the first conventional example shown in FIG. 29, a doughnut-like magnetic field is formed. As a result, the magnetic field strength in parallel with the surface of the wafer 16 varies extensively depending on the location as shown in FIG. 30.

Reference is made to FIG. 30, wherein the horizontal axis of the graph denotes the distance (r) from the center of the plasma zone (viz., the position immediately above the center point of the wafer 16) toward the circumference of the wafer, and wherein the vertical axis denotes the strength (H) of the magnetic field in parallel with the surface of the wafer 16. As mentioned above, as the horizontal magnetic field strength is larger, the density of puma produced is higher, and as such, the conventional example described with reference to FIG. 29 has encountered the problem that the wafer is partially etched. Further, the lack of uniformity of plasma results in potential distribution on the surface of the wafer (viz., results in charge-up), and consequently, leading to the fact that the elements formed on the wafer may be damaged.

In order to solve such a problem, it is vital to uniform the strength of the horizontal magnetic field over the largest possible range in the vicinity of the surface of the wafer 16. However, with the conventional apparatus shown in FIG. 29, it is not possible to address this difficulty.

In order to solve the above-mentioned problem, it is known in the art, as shown in FIG. 31, to make use of a dipole-ring magnet (denoted by reference numeral 35) which comprises a plurality of columnar anisotropic segment magnets arranged in the shape of ring. FIG. 31(a) is a top plan view showing the dipole-ring magnet 35, and FIG. 31(b) is a cross sectional view taken along a section line A-B of FIG. 31(a).

As shown in FIG. 31(a), the dipole-ring magnet 35 is configured such that a plurality of anisotropic segment magnets 40 are embedded in the base or support 42 of non-magnet material. As shown in FIG. 31(b), each of the plurality of segment magnets 40 is provided with a spacer 41 of non-magnetic material (for example, aluminum etc.) at the center in the lengthwise direction thereof in order to adjust the amount of magnetic flux.

The number of the anisotropic segment magnets 40 is eight or more, and is typically selected between eight(8) and thirty-two(32). In the particular case shown in FIG. 31, the number of magnets 40 is 16. The cross section of the anisotropic segment magnet 40 is arbitrary, and thus, the cross section may be circular, square, rectangular, trapezoidal, etc., and, the case illustrated in the drawing takes the form of rectangle. The arrows in the rings of the anisotropic segment magnets 40 respectively denote the directions of magnetization of the corresponding segment magnets. In the case where the segment magnets are arranged such that the directions of the magnetization thereof are as illustrated in FIG. 31(a), the magnetic field indicated by an arrow 43 is generated within the ring.

Inside the ring of the dipole-ring magnet 35, there are provided the plate-like electrodes 36 and 37 arranged in parallel with each other, and a wafer 38 is mounted on the plate-like electrode 37. As in the first prior art shown in FIG. 29, the high-frequency alternating electric field is generated between the plate-like electrodes 36 and 37 due to the high-frequency voltage applied to the plate-like electrodes 36 and 37. An arrow 44 indicates the direction of the electric field generated between the plate-like electrodes 36 and 37 at a certain time point High-density plasma is generated by the interaction between the electric field and the magnetic field.

When the dipole-ring magnet 35 is used with the magnetic field generator for magnetron plasma generation, it is necessary, as shown in FIG. 31(b), to generate the plasma formation space 46 near the central cross section C-D perpendicular to the lengthwise direction of the dipole-ring magnet 35.

This is because the magnetic field uniformity at the central cross section C-D normal to the lengthwise direction of the dipole-ring magnet 35 is better than the magnetic field uniformity near the lengthwise end of the magnet 35, and because at or in the vicinity of the central cross section C-D normal to the lengthwise direction of the magnet 35, the horizontal components of the lines of magnetic force are absolutely predominant which are very effective in order to confine the electrons above the surface of the wafer. For this reason, it is necessary to bring the plasma generation space 46 at or near the central section C-D perpendicular to the lengthwise direction of the dipole-ring magnet 35. That is to say, it is necessary, prior to entering into the etching process, to adjust the vertical location of the wafer 38 so that the space near the upper surface of the wafer 38 (viz., plasma formation space 46) must be brought to the central cross section C-D which is perpendicular to the lengthwise direction of the dipole-ring magnet 35.

FIG. 32 is a diagram schematically showing the magnetic field uniformity at the central cross section C-D perpendicular to the lengthwise direction of the dipole-ring magnet 35. In FIG. 32, the horizontal axis of the graph denotes the distance (r) from the center of the central cross section C-D toward the circumference thereof, and the vertical axis denotes the horizontal magnetic field strength (H). Character L indicates the radius of the plasma space 46. As understood from FIG. 32, the dipole-ring magnet is able to attain much better magnetic field uniformity than that of the first prior art (FIG. 30)(in other words, much flatter horizontal magnetic field strength can be realized).

In the following, in order to facilitate an understanding of the present invention, the outline of the known magnetron plasma etching apparatus will be described with reference to FIG. 33.

As shown in FIG. 33, the magnetron plasma etching apparatus is roughly divided into an etching chamber or room (A), a load lock chamber (C), and a cassette chamber (B), wherein the adjacent chambers are connected by way of a valve 49. One of a plurality of wafers 50 provided in the cassette chamber (B) is transferred into the etching chamber (A) using a conveyance arm 54 provided within the load lock chamber (C). The wafer, which is denoted by reference numeral 52 and which is transferred, using the conveyance arm 54, into the etching room (A), is placed on the plate-like electrode 56 in the etching chamber. Following this, the plate-like electrode 56 and the wafer 52 are lifted up to an etching position 60, which is denoted by a phantom line, by way of a lift 58.

Subsequently, etching is implemented by generating high-density plasma in the space in the vicinity of the upper surface of the wafer 52, which has been placed at the etching position, by way of the interaction between the electric field generated between the plate-like electrodes 56 and 62 and the magnetic field generated by the magnetic field generator (viz., dipole-ring magnet 64). When implementing the etching, a process gas is introduced into through a gas induction pipe 66 and discharged from a gas exhaust pipe 68. In addition, the gas exhaust pipe 68 is also connected to the cassette chamber (B) and the load lock chamber (C) in order to discharge the process gas which flows thereinto when the valve 49 is opened.

As mentioned above, after the wafer is transferred into the reaction room (processing room) such as the etching chamber, it is necessary to raise, using a lift, the position in the vicinity of the top surface of the wafer up to the best location wherein the best magnetic field uniformity is present at the center portion of the dipole-ring magnet. Furthermore, after the wafer has been processed, the wafer should be lowered, using the lift, to a wafer taking-out position which is the same as that of the wafer carrying-in position). Therefore, in order to decease the size of the magnetron plasma apparatus, simplify the structure thereof, and prevent the generation of dust from the lift mechanism, it is highly desirable to shorten the wafer's vertical travel distance within the etching chamber as much as possible. Furthermore, it is quite desirable if it is able to render it unnecessary to vertically transfer the wafer itself.

By the way, as mentioned above, the etch uniformity can be improved to some extent by using the dipole-ring magnet. However, it became clear that the etch uniformity varies depending on the film material to be etched. More specifically, the prior art suffers from the difficulties that the uniformity of etching varies in the radial direction of the wafer, and the etching profile becomes uneven in the diameter direction of the wafer. The inventors of the instant patent application have made extensive efforts to overcome the aforesaid problems, and concluded that it is possible to further improve the etch uniform if the incidence angle of the magnetic force line to the wafer surface is controlled while changing no magnetic field strength. The just-mentioned phrase "the incidence angle of the magnetic force line to the wafer surface is controlled" implies that the direction of the magnetic field relative to the wafer surface on which the etching is to be implemented is controlled. By using this control, it became clear that the etch uniformity is markedly improved. The inventors has noticed that it is possible to effectively control the etch uniformity by changing the angle of the magnetic field (viz., line of magnetic force) to the wafer surface, and further noticed that there exists an optimum angle(s) according to the conditions relating to an etching gas(es) and the kinds of films to be etched It is therefore an object of the present invention to provide a magnetic field generator for magnetron plasma generation wherein the direction of the magnetic field to a wafer surface (viz., the direction of the magnetic field in the vicinity of the wafer surface to be etched) can be controlled so as to attain the etch uniformity.

Another object of the present invention is to provide an etching apparatus or system and method, all of which utilize the above-mentioned magnetic field generator for magnetron plasma generation.

DISCLOSURE OF INVENTION

The present invention relates to a magnetic field generator for magnetron plasma generation which comprises a dipole-ring magnet with a plurality of columnar anisotropic segment magnets arranged in a ring-like manner, characterized in that the direction of magnetic field relative to the surface of a wafer to be plasma treated is controlled.

Further, the present invention relates to a magnetic field generator for magnetron plasma generation which comprises a dipole-ring magnet with a plurality of columnar anisotropic segment magnets arranged in a ring-like manner, characterized in that the direction of magnetic field relative to the surface of a wafer, which wafer is processed at a position away from the central position of the dipole-ring magnet, is controlled such as to be in parallel with the surface of the wafer.

Still further, the present invention relates to a magnetic field generator for magnetron plasma generation which comprises a dipole-ring magnet with a plurality of columnar anisotropic segment magnets arranged in a ring-like manner, characterized in that the dipole-ring magnet comprises first and second dipole-ring magnets, and the first and second dipole-ring magnets are different in length with each other in the direction of central axis thereof.

Still further, the present invention relates to a magnetic field generator for magnetron plasma generation which comprises a dipole-ring magnet with a plurality of columnar anisotropic segment magnets arranged in a ring-like manner, characterized in that the dipole ring magnet comprises first and second dipole-ring magnets, and the first and second dipole-ring magnets are different in the magnetic field strength thereof.

Still further, the present invention relates to a magnetic field generator for magnetron plasma generation which comprises a dipole-ring magnet with a plurality of columnar anisotropic segment magnets arranged in a ring-like manner, characterized in that the generator is provided with at least one magnetic field direction control means for controlling the direction of the magnetic field of the dipole-ring magnet.

Still further, the present invention relates to a magnetic field generator for magnetron plasma generation which comprises a dipole-ring magnet with a plurality of columnar anisotropic segment magnets arranged in a ring-like manner, characterized in that the dipole-ring magnet comprises first and second dipole-ring magnets, and at least one of the first and second ring-like magnets is provided such as to be movable in the direction of the central axis of the dipole-ring magnet.

Still further, the present invention relates to a magnetic field generator for magnetron plasma generation which comprises a dipole-ring magnet with a plurality of columnar anisotropic segment magnets arranged in a ring-like manner, characterized in that the dipole-ring magnet comprises first and second dipole-ring magnets provided in the direction of the central axis of the dipole-ring magnet, and the segment magnets, except for predetermined magnets, of at least one of the first and second dipole-ring magnets are such that each has the magnetic field whose direction is at an angle with respect to said central axis.

Still further, the present invention relates to a method of etching a workpiece using a dipole-ring magnet with a plurality of columnar anisotropic segment magnets arranged in a ring-like manner, and using first and second plate-like electrodes provided in parallel inside the dipole-ring magnet, and the workpiece is mounted on one of the first and second plate-like electrodes, characterized in that the etch rate uniformity on the entire surface of the workpiece is controlled by adjusting the angle of the magnetic field at the edge of the workpiece.

Still further, the present invention relates to a method of etching a workpiece using a dipole-ring magnet with a plurality of column anisotropic segment magnets arranged in a ring-like manner, and using fist and second plate-like electrodes provided in parallel inside the dipole-ring magnet, and the workpiece is mounted on one of the first and second plate-like electrodes, characterized in that when the etch rate at the edge of the workpiece is desired to be decreased with respect to the etch rate at the central portion of the workpiece, the angle of the magnetic field at the edge of the workpiece is made larger.

Still further, the present invention relates to a method of etching a workpiece using a dipole-ring magnet with a plurality of columnar anisotropic segment magnets arranged in a ring-like manner, and using first and second plate-like electrodes provided in parallel inside the dipole-ring magnet, and the workpiece is mounted on one of the first and second plate-like electrodes, characterized in that (a) measuring etch rates at the edge and at the central portion of the workpiece after completing a given etching treatment, (b) obtaining the measurement result issued at step (a), and controlling, on the basis of the measurement result obtained, the angle of the magnetic field at the edge such as to become larger compared to the angle of the magnetic field at step (a) if the etch rate at the edge of the workpiece is to be made smaller than the etch rate at the central portion of the workpiece, and proceeding to the following etch treatment, and (c) obtaining the measurement result issued at step (a), and controlling, on the basis of the measurement result obtained, the angle of the magnetic field at the edge such as to become smaller compared to the angle of the magnetic field at step (a) if the etch rate at the edge of the workpiece is to be made larger than the etch rate at the central portion of the workpiece, and proceeding to the following etch treatment

BRIEF DESCRIPTION OF DRAWINGS

FIG. 13 is a diagram for describing the case where a ring-lie magnet is rotated which is used with the modification of the magnetic field generator for magnetron plasma generation according to the embodiment of the third invention shown in FIG. 9, and for describing the operation of a ring-like magnet which is a further variant of the above-mentioned modification.

FIG. 23 is a diagram for use in describing a magnetic field generator for magnetron plasma generation according to the embodiment of a sixth an invention.

FIG. 26 is a table showing a relationship between the magnetic field angle $\theta$ at the wafer edge and the magnetized directions of the segment magnets which constitute the dipole-ring magnet shown in FIG. 25.

FIG. 28 is a diagram showing the etch uniformity obtained using a method or an apparatus according to the embodiment of the seventh invention, and the etch uniformities obtained by way of experiments for the purpose of comparing them with those obtained by the seventh invention.

FIG. 29 is a longitudinal cross sectional view showing the conventional plasma etching system.

BEST EMBODIMENTS FOR IMPLEMENTING THE INVENTION

In the following, the most preferable embodiments of the plurality of inventions of the instant specification will be described with reference to FIGS. 1 to 28.

The embodiment of the first invention will be discussed with reference to FIGS. 1 to 8.

According to the embodiment of the first invention, in the magnetic field generator for magnetron plasma generation which is equipped with a dipole-ring magnet wherein a plurality of columnar anisotropic segment magnets are provided in the shape of a ring, the lengths of first and second dipole-ring magnets, which constitute the dipole-ring magnet and provided in the vertical direction, are made different, respectively.

Each of the plural columnar anisotropic segment magnets (hereinafter sometimes referred to simply as segment magnets), which constitute the dipole-ring magnet used in the present invention, is divided into two parts. Therefore, as mentioned above, it can be said that the dipole-ring magnet is provided with the first and second dipole-ring magnets which are divided into upper and lower portions. For this reason, in the instant specification, the expression that the first and second dipole-ring magnets are different in length, implies that the segment magnets of each of the first and second dipole-ring magnets are different in length.

Figure 1:
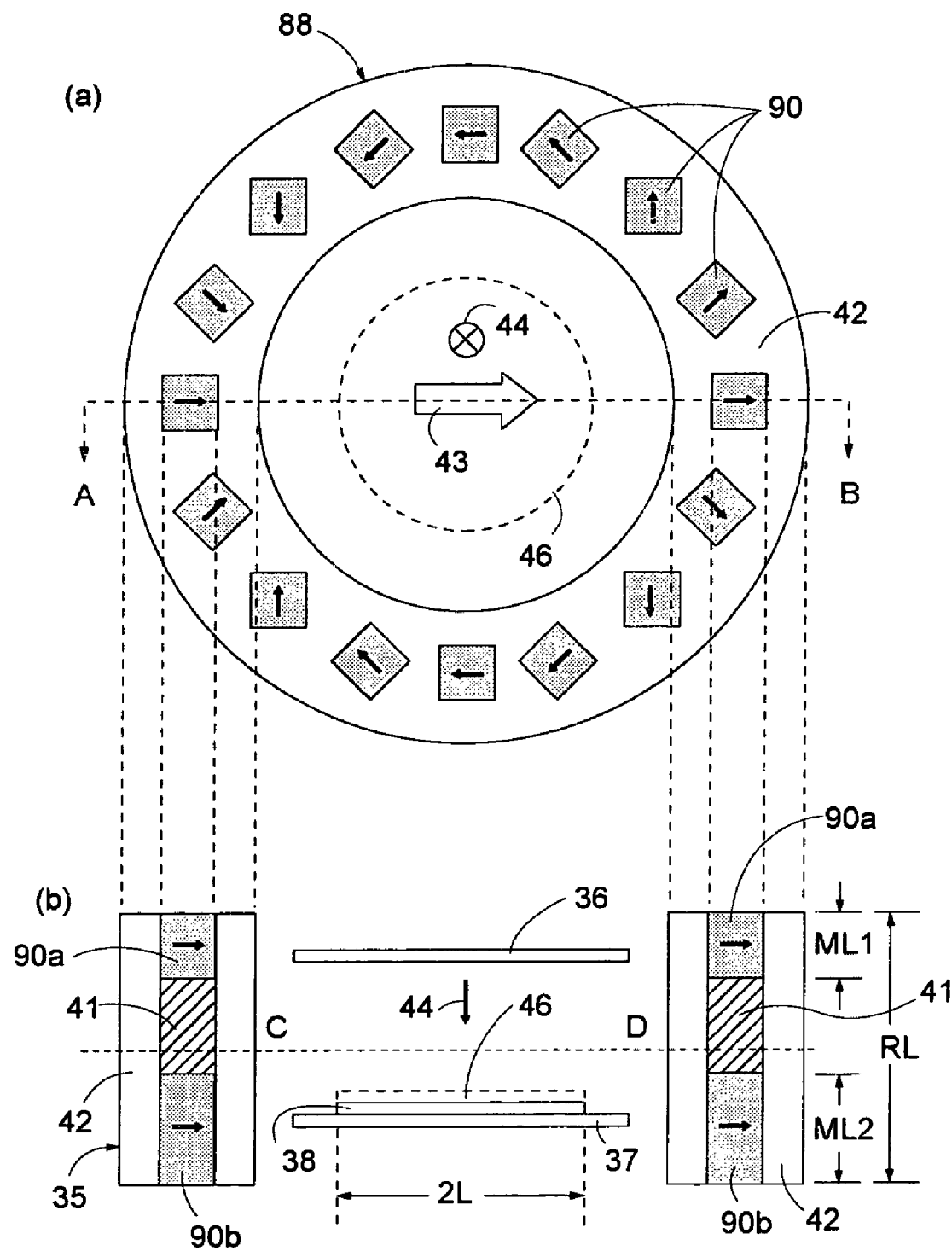
FIG. 1 is a diagram for describing a magnetic field generator for magnetron plasma generation according to the embodiment of a first invention.
Figure 2:
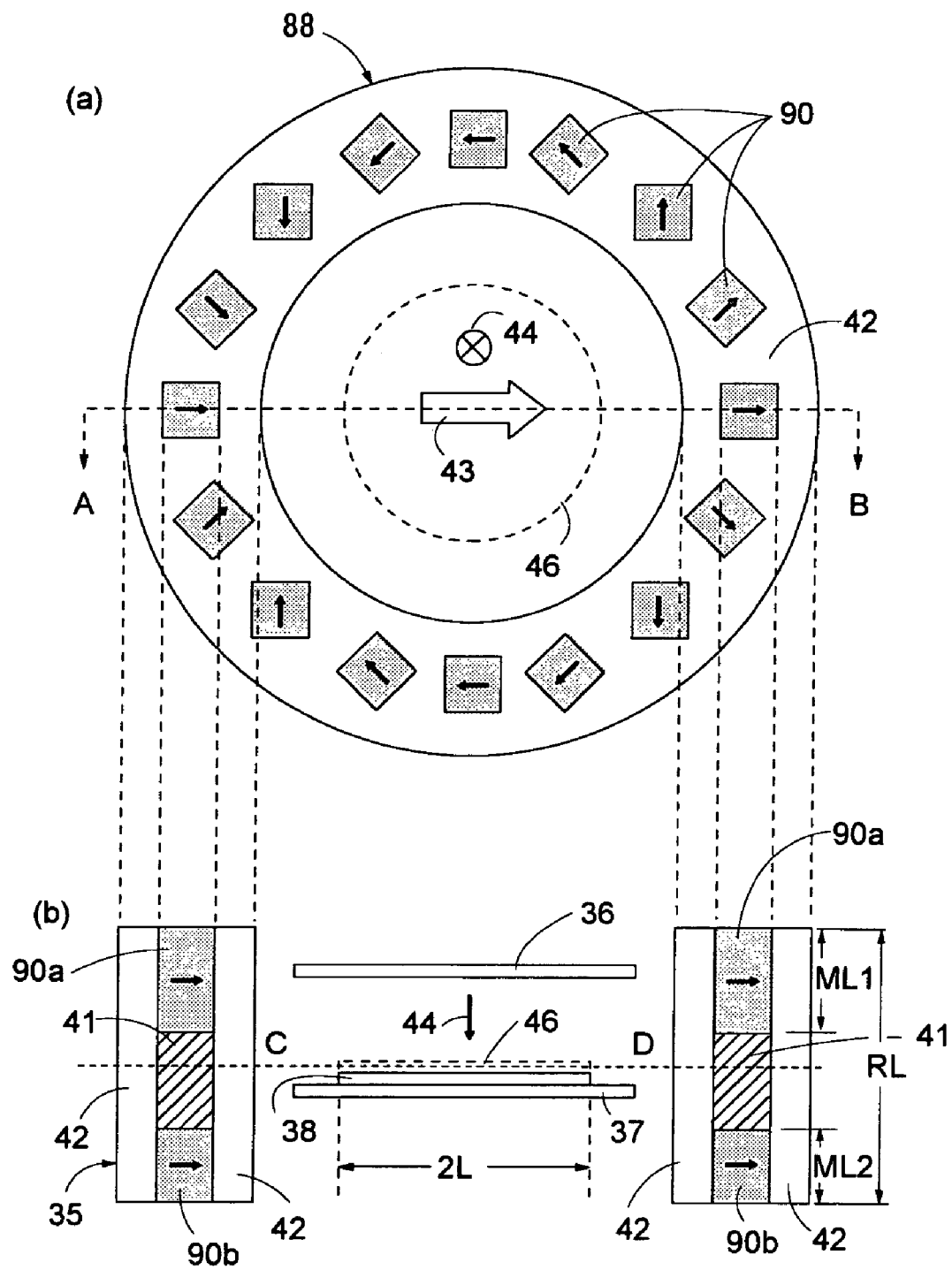
FIG. 2 is a diagram for describing another magnetic field generator for magnetron plasma generation according to the embodiment of the first invention.
Figure 31:
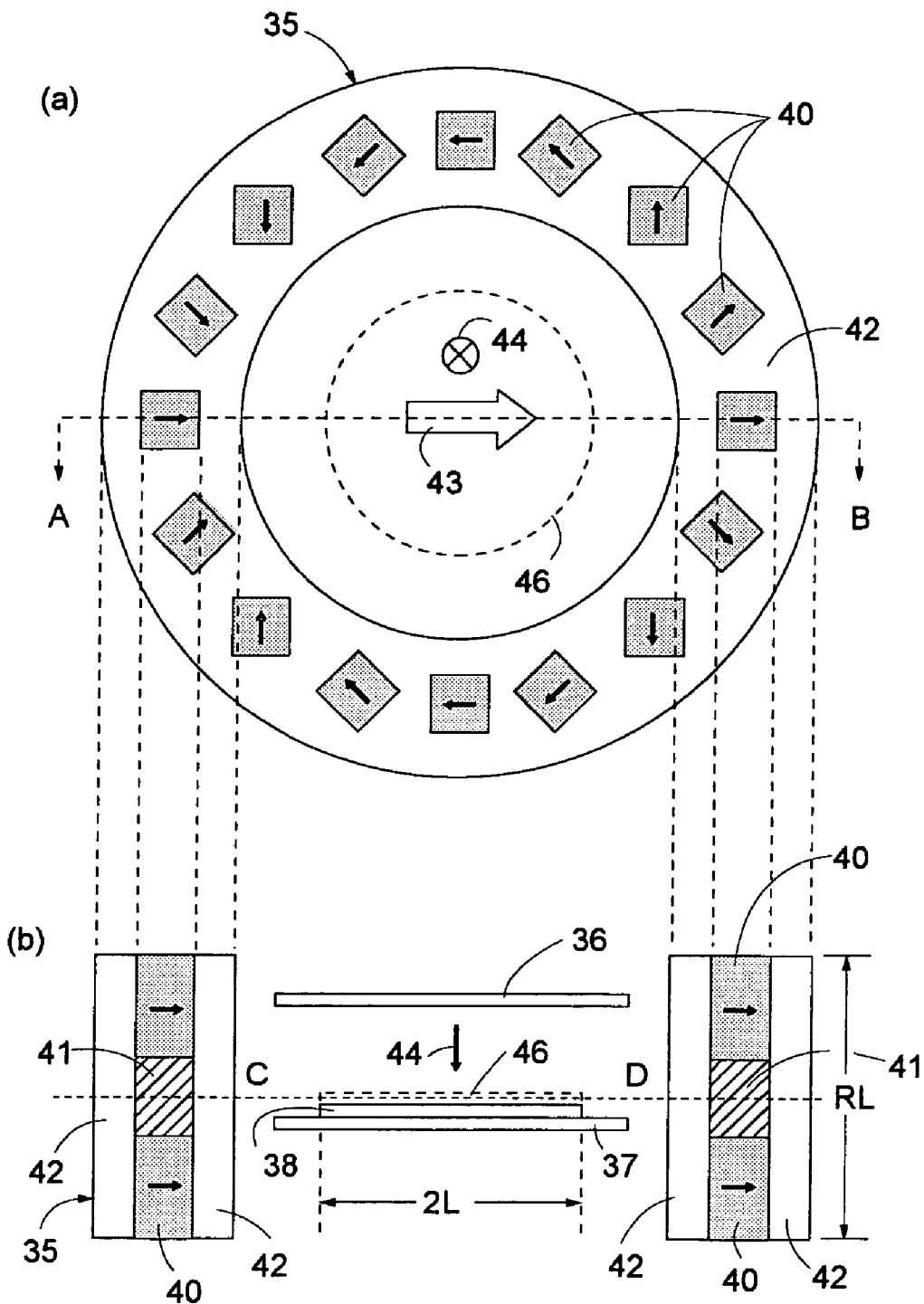
FIG. 31 is a diagram showing the conventional dipole-ring magnet wherein a plurality of columnar anisotropic segment magnets are provided in the shape of ring.
Figure 32:
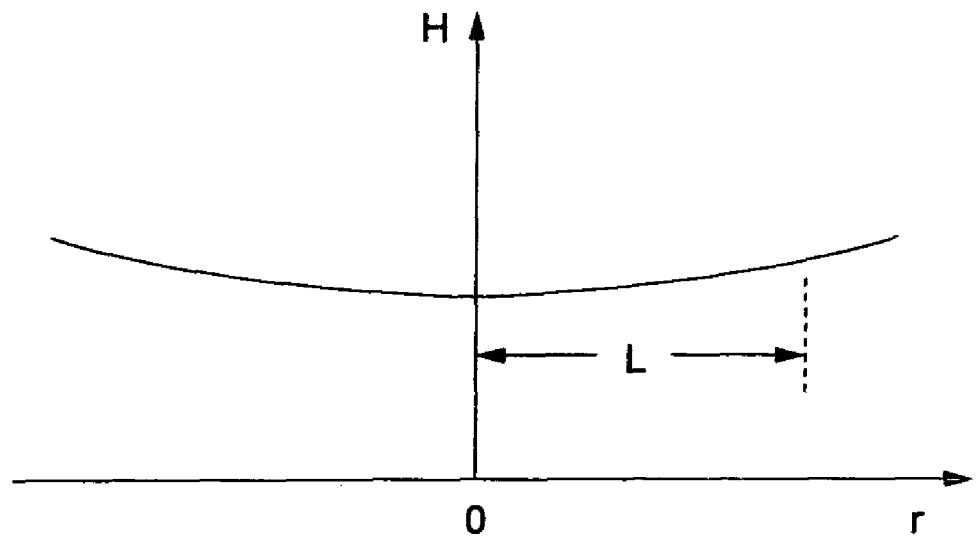
FIG. 32 is a sketch showing the magnetic field uniformity at the central cross section normal to the longitudinal direction of the dipole-ring magnet of FIG. 31.

The apparatus shown in FIGS. 1 and 2 is identical to that shown in FIG. 31 except that the length of the segment magnet is different. Accordingly, in FIGS. 1 and 2, a reference numeral 90 is attached to each of the segment magnets, and the dipole-ring magnet equipped with these segment magnets are denoted by 88. By the way, in FIGS. 1 and 2, the same reference numbers are respectively attached to the same or corresponding parts as those already described with reference to FIG. 31, and the descriptions thereof will be omitted or only brief descriptions thereof will be given.

FIG. 1(a) is a top plan view of the dipole-ring magnet 88, and FIG. 1(b) is a cross sectional view taken along section line A-B of FIG. 1(a). The dipole ring magnet 88 of FIG. 1 is, as in the case of FIG. 31, configured such that a plurality of segment magnets 90 are embedded in the base (support) 42 of non-magnetic material and are respectively equipped with the spacers 41 of non-magnetic material. The number of the segment magnets 90 and the arrangement thereof are identical to those referred to with reference to FIG. 31. Furthermore, as in the conventional apparatus mentioned above, the plate-like electrodes 36 and 37 are provided in parallel with each other within the ring of the dipole-ring magnet 88, and the wafer 38 is positioned on the electrode 37 (however, the illustration of a susceptor is omitted). In a similar manner, FIG. 2(a) is a top plan view of the dipole-ring magnet 88, and FIG. 2(b) is a cross sectional view taken along section line A-B.

According to the embodiment of the first invention, each of the segment magnets 90 is provided with magnets 90a and 90b on both sides of the spacer 41, and the magnets 90a and 90b have different lengths (respectively denoted by ML1 and ML2) in the longitudinal (lengthwise) direction of the dipole-ring magnet. In FIG. 1, ML1<ML2, and in FIG. 2, ML1>ML. In other words, it can be said that the dipole-ring magnet 88 shown in FIG. 1 (or FIG. 2) is provided with a first dipole-ring magnet with the segment magnets 90a and a second dipole-ring magnet having the segment magnets 90b.

Figure 3:
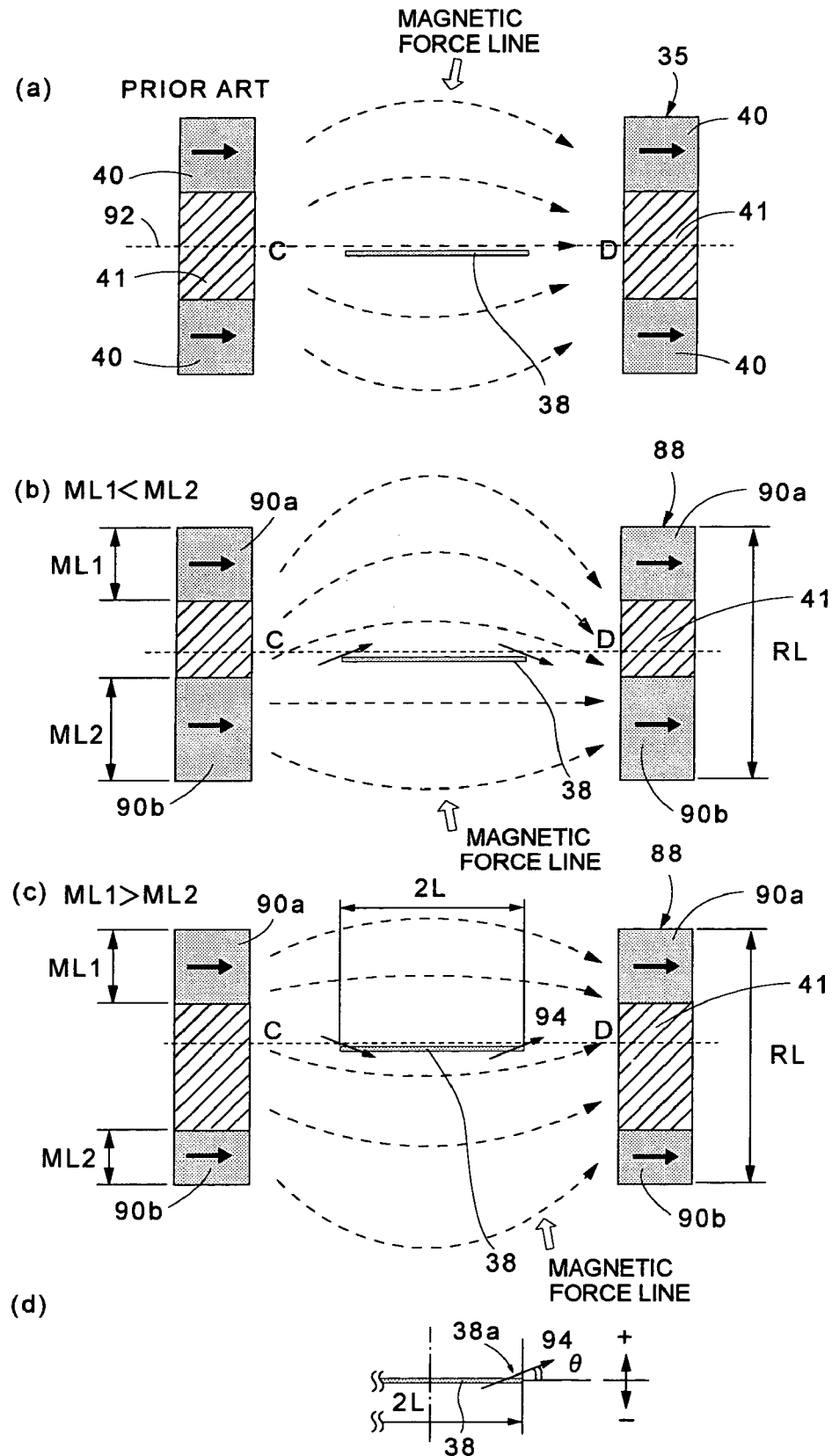
FIG. 3 is a diagram for comparing the lines of magnetic force (magnetic field) generated by the conventional magnetic field generator for magnetron plasma generation and the lines of magnetic force (magnetic field) generated by the magnetic field generator for magnetron plasma generation shown in FIGS. 1 and 2.

There will be described, with reference to FIG. 3, the difference between the magnetic field generated by the dipole-ring magnet 35 (FIG. 31) comprising the conventional segment magnets, and the magnetic field generated by the dipole-ring magnet 88 according to the first invention.

FIG. 3(a) shows the lines of magnetic force in the cross section A-B of the conventional dipole-ring magnet 35 (FIG. 31). A dashed line 92 extending in the horizontal direction is contained in the central cross section C-D which is normal to the longitudinal or lengthwise direction of the dipole-ring magnet 35. As mentioned above, the line of magnetic force in this portion is approximately in parallel with the cross section C-D (viz., normal to the central axis), but, the magnetic force line curves or bends large as it goes toward the end of the dipole-ring magnet 35 along the central axis thereof.

On the other hand, FIG. 3(b) shows the lines of magnetic force in the cross section taken from the line A-B (FIG. 2) of the dipole-ring magnet 88 according to the embodiment of the first invention. As seen from FIG. 3(b), when the upper magnet 90a is made shorter than the lower magnet 90b (ML1<ML2), the magnetic field generated by the magnet 90a decreases while the magnetic field generated by the magnet 90b incases. Therefore, the direction of the magnetic field near the central cross section C-D of the dipole-ring magnet is first upward and then changes downward (viz., the direction of the magnetic force line is convex upward). From a different point of view, it can be said that the location wherein the horizontal magnetic field is displaced below the central cross section C-D of the dipole-ring magnet 88. Furthermore, as shown in FIG. 3(c), in the case where the upper magnet 90a is made longer than the lower magnet 90b (ML1>ML2), the direction of the magnetic field near the central cross section C-D of the dipole-ring magnet is first downward and then changes upward (viz., the direction of the magnetic force line is in the down-to-up direction).

As mentioned above, the direction of the magnetic field relative to the wafer surface positioned near the central cross section C-D of the dipole-ring magnet 35 can be controlled by changing the lengths of the segment magnets 90a and 90b (ML1 and ML2 respectively). In the instant specification, the control of the direction of the magnetic field relative to the wafer surface will be explained as the control of the direction of the magnetic field at the end of the wafer for the convenience of description. FIG. 3(d) is a diagram for defining the angle θ of the line of magnetic force 94 (the angle of the magnetic field) at one end 38a of the wafer 38 (or the near the end of the wafer 38). As shown in FIG. 3(d), the magnetic field angle θ at the wafer end 38a is measured from a reference surface which is the sure in parallel with the central cross section C-D (θ=0°), and assumes respectively a positive and negative value when being measured upward and downward from the reference surface. On the other hand, although not illustrated, the magnetic field angle at the other end of the wafer 38 is made positive when the line of magnetic force crosses the reference surface from the upper side, and is made negative when the line of magnetic force crosses the reference surface from the lower side. In consideration of the symmetry of the magnetic field, the angles of the magnetic field at the both ends of the wafer are usually identical with each other. The following description focuses on the control of the magnetic field angle θ at the wafer end 38a unless otherwise stated.

By the way, the dipole-ring magnets 35 and 88 are rotated during plasma treatment (such as etching), and as such, the end of the wafer can be said as the wafer circumference.

The inventors conducted the experiments so as to check to determine the uniformity of etch rate on (across) the wafer surface by changing the angle θ of the magnetic field at the wafer edge 38a and the etched material under four conditions 1 to 4 as mentioned below. In this case, the direction of the magnetic field is controlled by making difference between the lengths of the segment magnets 90a and 90b. In the above-mentioned experiments, the magnetic field angle θ was changed so as to take 4.41°, 9.25°, and 12.88°, wherein the angle θ is positive and hence this is the case shown in FIG. 2. The etch rate was determined as follows. The film thickness was measured, before and after the etching, at a plurality of points on the wafer surface within the region except for the width of 3 mm from the wafer circumference (viz., wafer's edge) and along two perpendicular lines in the diametric direction. Thereafter, the difference between the film thicknesses measured before and after the etching (viz., etched amount) was divided by the etching time. In the process conditions set forth below, a resist layer or film was used as a substitute of an organic insulator film for reflecting the etching evaluation with respect to the organic insulator film. In FIGS. 4 to 7 which will be referred to later, the measured values at a plurality of positions on the wafer surface and along the two perpendicular lines in the direction of diameter, are denoted by black dots or black squares.

[Process Condition 1]
  Wafer diameter: 300 mm
  Frequency of high frequency power supply 13.56 MHz
  Electric power of high frequency power supply: 460 W
  Gap between evades: 40 mm
  Magnetic field strength at the center portion of the wafer about 120 Gauss
  Etched film: resist
  Etching Gas: $N_2/O_2$=95/190 sccm
  Chamber internal pressure: 30 mTorr
  Susceptor temperature: 10° C.

[Process Condition 2]
  Wafer diameter: 300 mm
  Frequency of high frequency power supply: 13.56 Mz
  Electric power of high frequency power supply: 2300 W
  Gap between electrodes: 40 mm
  Magnetic field strength at the center portion of the wafer: about 120 Gauss
  Etched film: resist
  Etching gas: $N_2/H_2$=190/570 sccm
  Chamber internal pressure: 100 mTorr
  Susceptor temperature: 10° C.

[Process Condition 3]
  Wafer diameter: 300 mm
  Frequency of high frequency power supply. 13.56 MHz
  Electric power of high frequency power supply: 4000 W
  Gap between electrodes: 40 mm
  Magnetic field strength at the center portion of the wafer about 120 Gauss
  Etched film: silicon oxide film
  Etching gas: $C_4F_8$/CO/Ar/$O_2$=20/100/400/10 sccm
  Chamber internal pressure: 40 mTorr,
  Susceptor temperature: 40° C.

[Process Condition 4]
  Wafer diameter. 300 mm
  Frequency of high frequency power supply. 13.56 Mz
  Electric power of high frequency power supply: 360 W
  Gap between electrodes: 40 mm
  Magnetic field strength at the center portion of the wafer: about 120 Gauss
  Etched film: silicon nitride film
  Etching gas: $CH_2F_2/O_2$/Ar=50/40/200 sccm
  Chamber internal pressure: 125 mTorr
  Susceptor temperature: 60° C.

Figure 4:
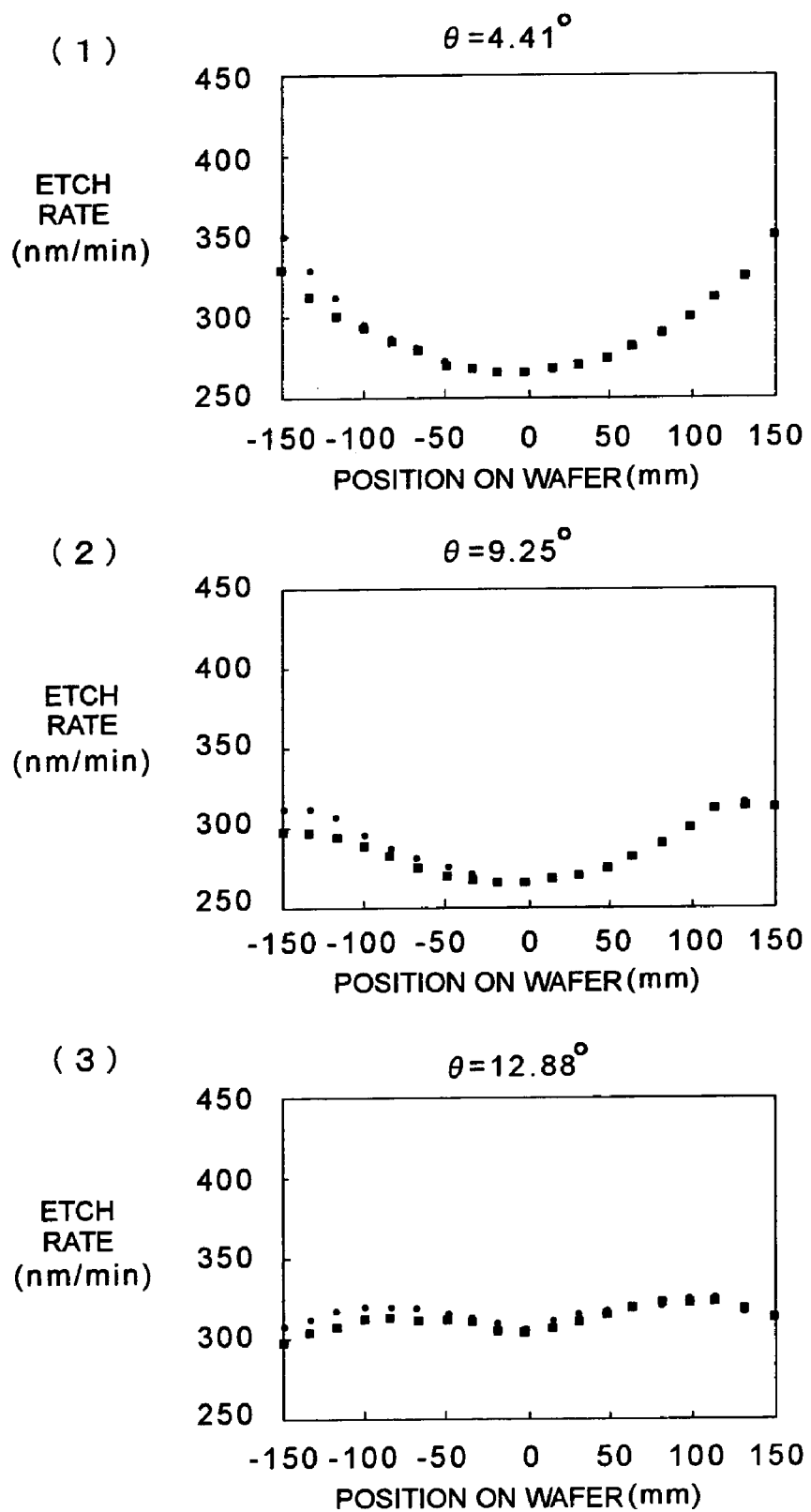
FIG. 4 is a diagram for use in illustrating the uniformity of etch rate when etching a resist while changing the magnetic field angle to the wafer surface, under a process condition 1, using the other magnetic field generator for magnetron plasma generation (FIG. 2) according to the embodiment of the first invention.

FIGS. 4(1) to 4(3) show the results of the etch rate uniformity on the wafer surface, when the resist was etched under the process condition 1, and when the angle θ at the wafer edge 38a was 4.41°, 9.25°, and 12.88°. When the magnetic field angle θ was 4.41°, the average etch rate on the wafer surface was 297.0 nm/min. The etch rate distribution was such that the etch rate at the circumference of the wafer was larger than that at the center portion thereof, and took the form of concave-like profile. The etch uniformity ((Max−Min)/(Max+Min)) was ±14.0%. When the magnetic field angle θ was 9.25°, the average etch rate on the wafer surface was 290.8 nm/min. The etch rate distribution was such that the etch rate at the circumference of the wafer was slightly larger than that at the center portion thereof, and took the form of concave-like shape. The etch uniformity was ±9.3%. The etch uniformity was improved compared to the case where the magnetic field angle θ was 4.41°. When the magnetic field angle θ was 12.88°, the average etch rate on the wafer surface was 308.2 nm/min. The etch rate distribution was approximately uniform, and the etch uniformity was ±3.7%. The etch uniformity was further improved compared to the case where the magnetic field angle θ was 9.25°.

Figure 5:
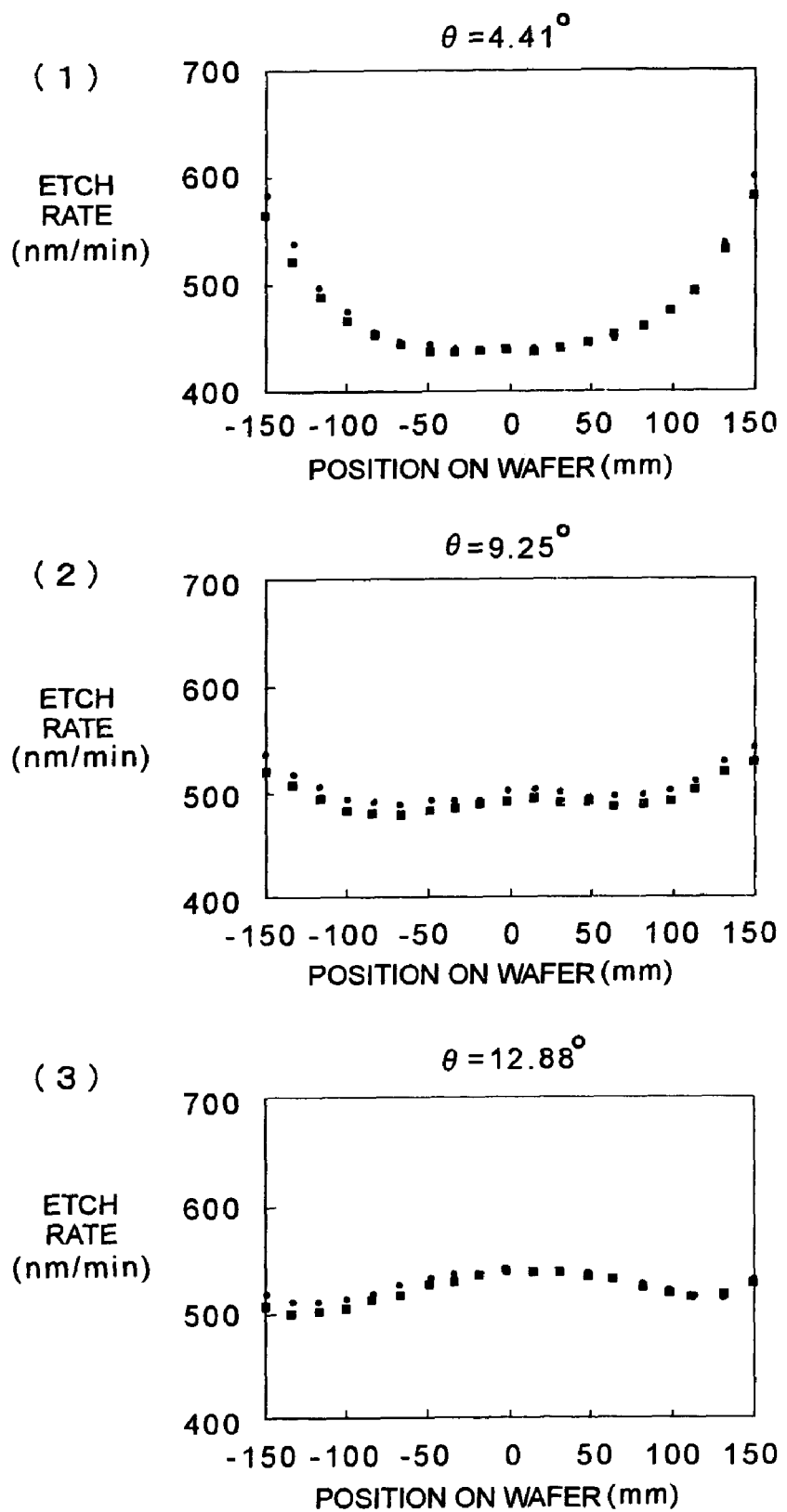
FIG. 5 is a diagram for use in illustrating the uniformity of etch rate when etching a resist while change the magnetic field angle to the wafer surface, under a process condition 2, using the other magnetic field generator for magnetron plasma registration (FIG. 2) according to the embodiment of the first invention.

FIGS. 5(1) to 5(3) show the results of the etch rate uniformity on the wafer surface, when the resist was etched under the process condition 2, and when the angle θ at the wafer edge 38a was 4.41°, 9.25°, and 12.88°. When the magnetic field angle θ was 4.41°, the average etch rate on the wafer surface was 487.8 nm/min. The etch rate distribution was such that the etch rate at the circumference of the wafer was larger than that at the center portion thereof, and took the form of concave-like profile. The etch uniformity was ±16.0%. When the magnetic field angle θ was 9.25°, the average etch rate on the wafer surface was 499.8 nm/min. The etch rate distribution did not show a notable or remarkable concave profile. The etch uniformity was ±4.6%. The etch uniformity was improved compared to the case where the magnetic field angle θ was 4.41°. When the magnetic field angle θ was 12.88°, the average etch rate on the wafer surface was 516.8 nm/min. The etch rate distribution was such that, contrary to the case where the magnetic field angle θ was 4.41°, the etch rate at the center portion of the wafer is slightly larger than that at the circumference thereof, and took the form of convex-like profile. The etch uniformity was ±3.2%. The etch uniformity was improved a little relative to the case where the magnetic field angle θ was 9.25°.

Figure 6:
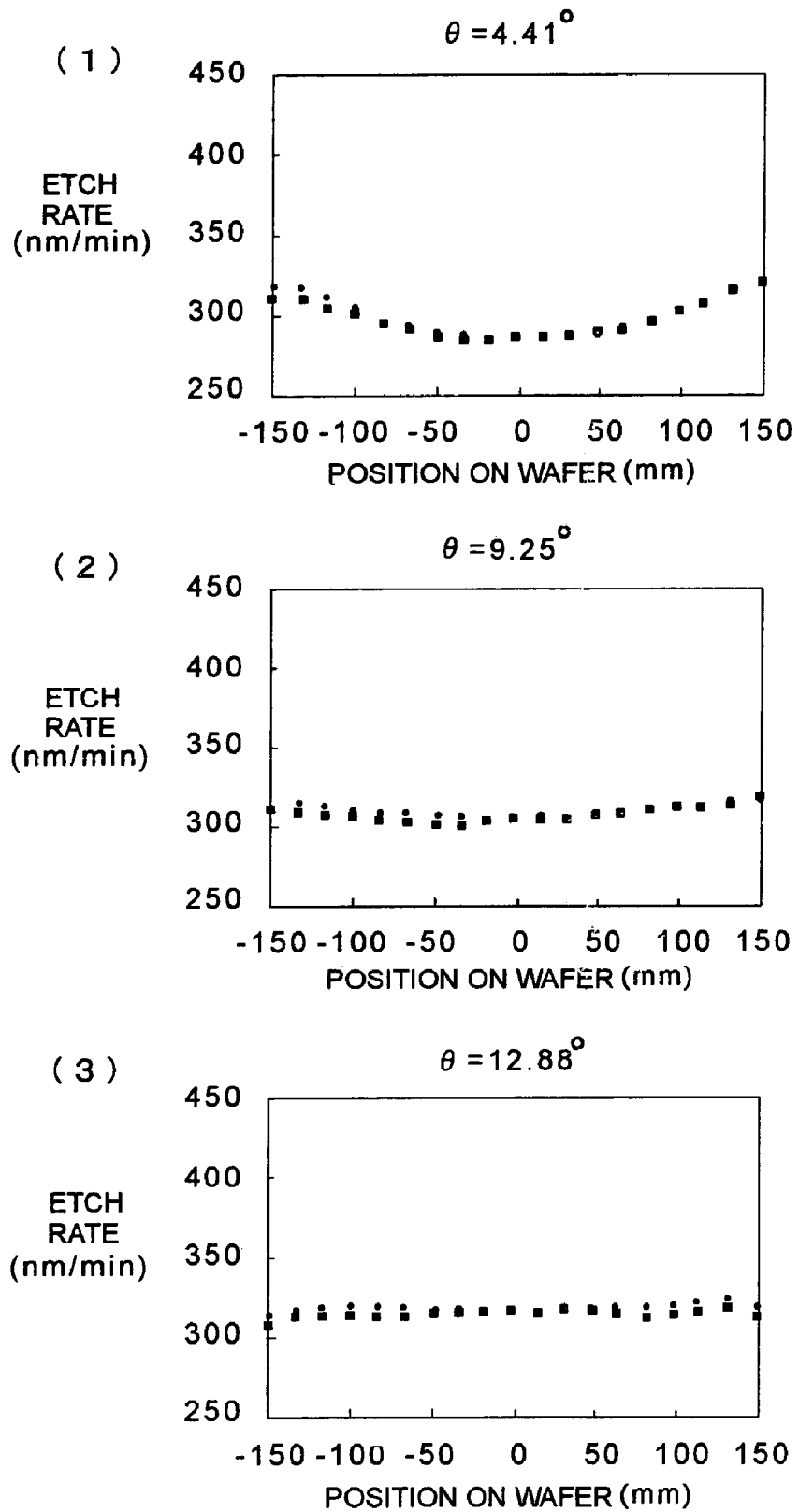
FIG. 6 is a diagram for use in illustrating the uniformity of etch rate when etching a resist while changing the magnetic field angle to the wafer surface, under a process condition 3, using the other magnetic field generator for magnetron plasma registration (FIG. 2) according to the embodiment of the first invention.

FIGS. 6(1) to 6(3) show the results of the etch rate uniformity on the wafer surface, when the silicon oxide film was etched under the process condition 3, and when the angle θ at the wafer edge 38a was 4.41°, 9.25°, and 12.88°. When the magnetic field angle θ was 4.41°, the average etch rate on the wafer surface was 298.5 nm/min. The etch rate distribution was such that the etch rate at the circumference of the wafer was slightly large than that at the center portion thereof, and took the form of concave-like profile. The etch uniformity was ±5.6%. When the magnetic field angle θ was 9.25°, the average etch rate on the wafer surface was 305.1 nm/min. The etch rate distribution was approximately uniform, and the etch uniformity was ±2.1%. The etch uniformity was improved compared to the case where the magnetic field angle θ was 4.41°. When the magnetic field angle θ was 12.88°, the average etch rate on the wafer surface was 313.8 nm/min. The etch rate distribution was approximately uniform (there was a tendency that the etch rate was small a little at the wafer's circumference), and the etch uniformity was ±1.9%. The etch uniformity was slightly improved compared to the case where the magnetic field angle θ was 9.25°.

Figure 7:
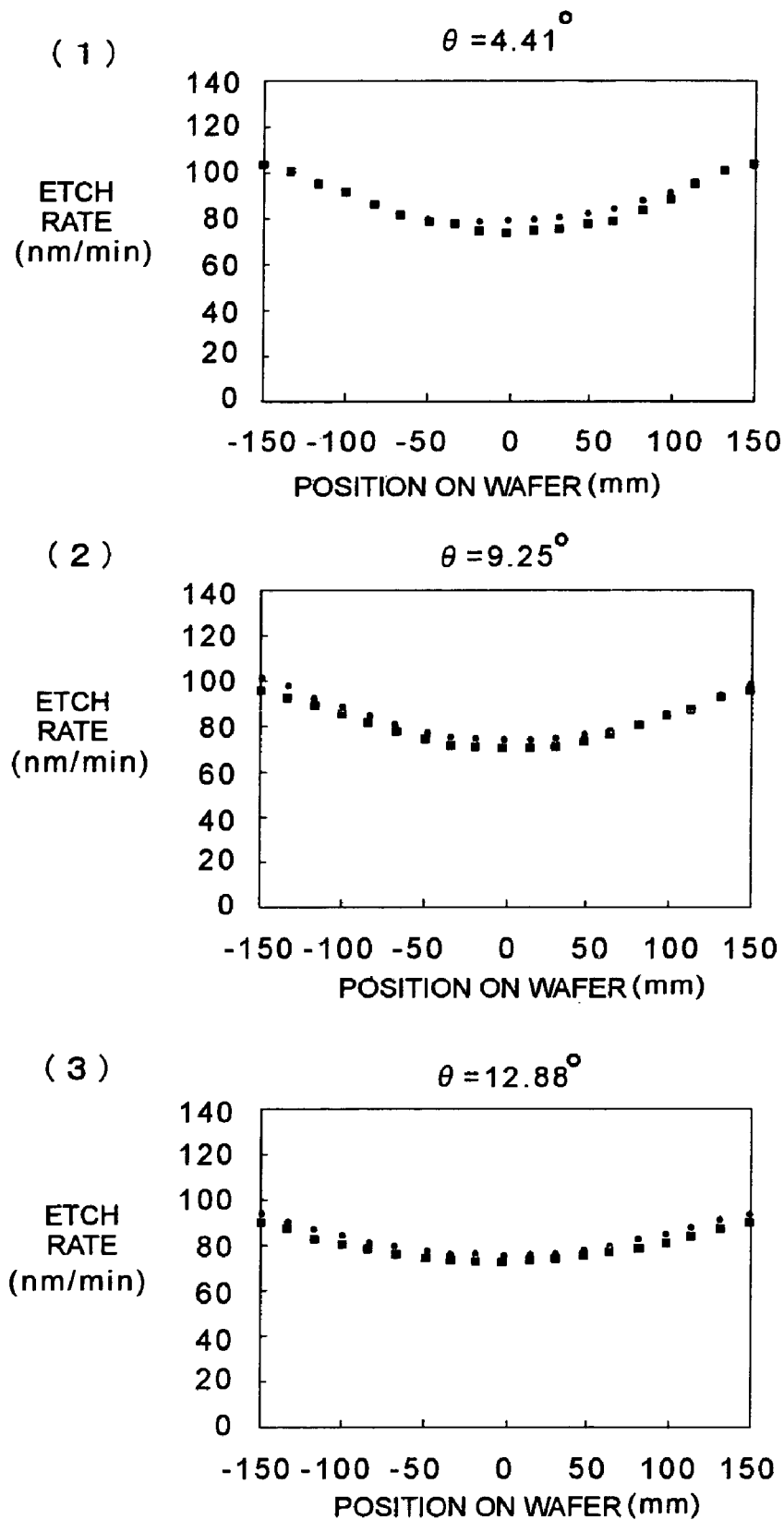
FIG. 7 is a diagram for use in illustrating the uniformity of etch rate when etching a resist while changing the magnetic field angle to the wafer surface, under a process condition 4, using the other magnetic field generator for magnetron plasma generation FIG. 2) according to the embodiment of the first invention.

FIGS. 7(1) to 7(3) show the results of the etch rate uniformity on the wafer surface, when the resist was etched under the process condition 4, and when the angle θ of the magnetic field was 4.41°, 9.25°, and 12.88°. When the magnetic field angle θ was 4.41°, the average etch rate on the wafer surface was 89.4 nm/min. The etch rate distribution was such that the etch rate at the circumference of the wafer was larger than that at the center portion thereof, and took the form of concave-like profile. The etch uniformity was ±15.9%. When the magnetic field angle θ was 9.25°, the average etch rate on the wafer surface was 86.4 nm/min. The etch rate distribution was such that the etch rate at the circumference of the wafer was larger than that at the center portion thereof, and took the form of concave-like profile. The etch uniformity was ±14.1%. The etch uniformity was slightly improved compared to the case where the magnetic field angle θ was 4.41°. When the magnetic field angle θ was 12.88°, the average etch rate on the wafer surface was 84.9 nm/min. The etch rate distribution was such that the etch rate at the circumference of the wafer was slightly larger than that at the center portion thereof as in the case that the magnetic field angle θ was 4.41°, and took the form of concave-like profile. The etch uniformity was ±9.5%. The etch uniformity was further improved compared with the case where the magnetic field angle θ was 9.25°.

In the experiments conducted under the above-mentioned process conditions 1-4, the conditions of the processing apparatus employed were not necessarily set to optimum ones, and as such, the aforesaid results of the etch rate uniformity does not necessarily reflect the best values in connection with the etched materials. However, the results obtained are satisfactory for correlatively evaluating the effects of the present invention.

It turned out, from the experimental results under the above-mentioned process conditions 1-4, that the etch uniformity on the wafer surface can be improved. That is, the amount of etch at the wafer center portion and at the wafer circumference can be controlled, without changing largely the average etch rate, by changing the magnetic field angle at the wafer end while setting the magnetic field strength at the wafer central portion at a constant level. That is to say, in connection with any of silicon oxide film, silicon nitride film, and organic insulator film, when the etch rate at the wafer circumference is larger than the etch rate at the wafer central portion, the etch rate at the wafer circumference can be lowered relative to that at the waver central portion by way of increasing the magnetic field angle at the wafer circumference. Therefore, it is possible to improve the etch uniformity over the entire surface of the wafer. Likewise, when the etch rate at the wafer circumference is smaller than the etch rate at the wafer central portion, the etch rate at the wafer circumference can be raised relative to that at the waver central portion by way of decreasing the magnetic field angle at the wafer circumference. Therefore, it is possible to improve the etch uniformity over the entire surface of the wafer. The reason why the etch rate is lowered as the magnetic field angle increases, is that since the horizontal component of the magnetic force line relative to the wafer surface decreases with the result that the electronic drift, which contributes to the high-density-ionization of plasma, becomes difficult to be generated.

The optimum magnetic field angle at the wafer end may change depending on the kind of etched material, an etching gas, and other etching conditions. However, it is desirable to control the angle within 0° to 30° or 0° to −30°. However, since there is a possibility that the damage to the wafer may occur when the magnetic field angle is too large, it is desirable to control the magnetic field angle at the wafer end from 0° to about 13° or from 0° to about −13°. In addition, the etch rate at the wafer circumference is typically larger than that at the wafer's central portion, and hence, it is desirable in practice to control the magnetic field angle at the wafer end in the range from 4° to about −13° or from −4° to about −13°.

In the following, some concrete examples according to the embodiment of the first invention will further be describe. The length RL of the dipole-ring magnet was set to 165 mm. Further, each of the anisotropic segment magnets 40, whose number was 16 in total, was an Nd—Fe—B based magnet, having a 60 mm by 60 mm square cross section. The upper segment magnet 90a had a length ML1 of 47.5 mm, and the lower segment magnet 90b had a length ML2 of 27.75 mm, and the spacer 41 had a length of 90 mm. Under these conditions, the angle θ at the wafer edge in the central cross section C-D of the dipole-ring magnet was 4.41°. Further, the dipole-ring magnet identical to the above was used, and the length ML1 of the upper segment magnet 90a was set to 58.8 mm while the length ML2 of the lower segment magnet 90b was set to 16.5 mm, and the spacer had a length of 90 mm. In this case, the angle θ at the wafer edge in the central cross section C-D of the dipole-ring magnet was 9.25°. Still further, the dipole-ring magnet identical to the above was used, and the length ML1 of the upper segment magnet 90a was set to 67.5 mm while the length ML2 of the lower segment magnet 90b was set to 7.5 mm, and the spacer had a length of 90 mm. In this case, the angle θ at the wafer edge in the central cross section C-D of the dipole-ring magnet was 12.88°. Still further, the dipole-ring magnet identical to the above was used, and each of the lengths ML1 and ML2 were was set to 37.5 mm, and the spacer had a length of 90 mm. In this case, the angle θ at the wafer edge in the central cross section C-D of the dipole-ring magnet was 0°.

On the other hand, the dipole-ring magnet identical to the above was used, and the length ML1 of the upper segment magnet 90a was set to 30 mm while the length ML2 of the lower segment magnet 90b was set to 45 mm, and the spacer had a length of 90 mm. In this case, a horizontal magnetic field was able to be generated at around 15 mm below the central cross section C-D of the dipole-ring magnet. That is, as shown in FIG. 3(b), if the wafer is to be processed in the horizontal magnetic field, the wafer can be set below the center of the dipole-ring magnet. On the other hand, when the wafer is positioned in the central cross section C-D, the magnetic field in the vicinity of the wafer 38 can be formed or configured such as to swell upwardly at the middle.

Figure 8:
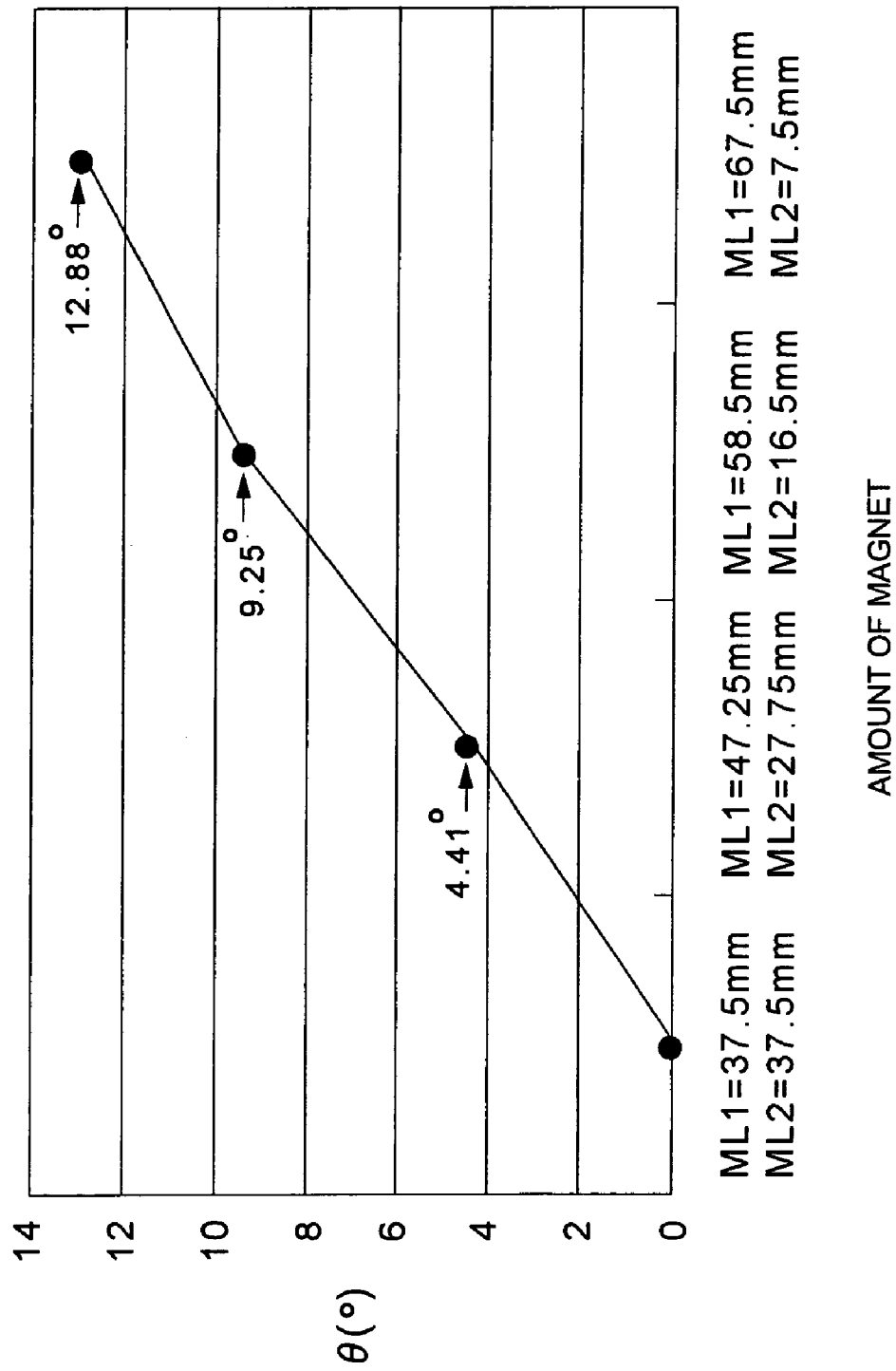
FIG. 8 is a graph for use in showing a relationship between the amount of magnet of an anisotropic segment magnet of each of the first and second dipole-ring magnets provided in the magnetic field generator for magnetron plasma registration according to the embodiment of the first invention and an angle $\theta$ of the magnetic field at the wafer edge.

FIG. 8 is a graph which shows that the angle θ of the magnetic field at the wafer end can be changed by changing each of the lengths (ML1 and ML2) of the upper and lower segment magnets.

In the first invention thus far described, it is possible to additionally provide a mechanism for adjusting the relative vertical location of the wafer 38 and the dipole-ring magnet. With this, if the results of the preceding etching (such as implemented in trial) is verified, it is possible, at the subsequent etching to realize the better etch uniformity compared with the preceding one. The relative location control of the wafer 38 and the dipole-ring magnet in the vertical direction can be implemented by vertically moving the plate-like electrodes 36 and 37 while maintaining the distance therebetween, or by vertically moving only the electrode 37. As an alternative, it is possible to vertically move the dipole-ring magnet without moving the wafer.

The second invention will be described with reference to the drawings which are selected from FIGS. 1 to 8 having been used to describe the first invention. According to the embodiment of the second invention, in the magnetic field generator for magnetron plasma generation which is equipped with the dipole-ring magnet which in turn comprises a plurality of columnar anisotropic segment magnets arranged in the shape of a ring, the residual magnetic flux densities (viz., magnetic field strengths) of the first and second dipole-ring magnets are made different with each other. The first and second dipole-ring magnets are provided in the vertical direction (viz., in the direction of the central axis of the dipole-ring magnet).

In order to make a difference between the residual magnetic flux densities of the first and second dipole-ring magnets, the different kinds of magnets, such as Sm—Co based magnets, Nd—Fe—B based magnets, etc. are selectively used as the first and second dipole-ring magnets, respectively. The lengths of the first and second dipole-ring magnets in the direction of the central axis thereof may be equal to with each other, or may be different with each other (namely, it is satisfactory if ML1=ML2 or if ML1≠ML2 (see FIGS. 1 and 2)).

The following description will be given to the case where the lengths of the fist and second dipole-ring magnets are made equal with each other. In FIG. 3(a), in the case where the upper magnet 90a is a ferrite magnet with residual magnetic flux density of 0.4 Tesla while the lower magnet 90b is a Nd—Fe—B based magnet with residual magnetic flux density of 1.3 Tesla, the amount of magnetic flux of the lower magnet 90a becomes larger than that of the upper magnet 90a. Thus, the magnetic field near the central cross section becomes such as to swell upwardly at the middle, as in the case of FIG. 3(b). Contrary to the above, if the upper magnet 90a is a Nd—Fe—B based magnet with the residual magnetic flux density of 1.3 Tesla while the lower magnet 90b is a ferrite magnet with the residual magnetic flux density of 0.4 Tesla, then the magnetic field near the central cross section becomes such as to swell downwardly at the middle, as in the case of FIG. 3(c).

In the above, the lengths of the first and second dipole-ring magnets in the direction of the central axis are made equal with each other. However, in the case where the upper magnet 90a is shorter than the lower magnet 90b as shown in FIG. 3(b), if the upper magnet 90a is a ferrite magnet with the residual magnetic flux density of 0.4 Tesla while the lower magnet 90b is a Nd—Fe—B based magnet with the residual magnetic flux density of 1.3 Tesla, then it can easily be understood that the magnetic field near the central cross section becomes such as to further swell upwardly at the middle compared with the case shown in FIG. 3(b) referred to in the description of the first invention. Furthermore, contrary to the above, in the case where the upper magnet 90a is longer than the lower magnet 90b as shown in FIG. 3(c), if the upper magnet 90a is a Nd—Fe—B based magnet with the residual magnetic flux density of 1.3 Tesla while the lower magnet 90b is a ferrite magnet with the residual mimetic flux density of 0.4 Tesla, then it can also easily be understood that the magnetic field near the central cross section becomes such as t further swell downwardly at the middle portion compared with the case shown in FIG. 3(c) and explained with reference to the first invention.

In the second invention, as in the first invention, it is possible to additionally provide a mechanism for adjusting the relative vertical location of the wafer 38 and the dipole-ring magnet. With this, if the results of the preceding etching (such as implemented in trial) is verified, it is possible, at the subsequent etching, to realize the better etch uniformity compared with the preceding one. The relative location control of the wafer 38 and the dipole-ring magnet in the vertical direction can be implemented by vertical moving the plate-like electrodes 36 and 37 provided in parallel while maintaining the distance therebetween, or by vertically moving only the electrode 37. As an alternative, it is possible to vertically move the dipole-ring magnet without moving the wafer.

In the following, the third invention will be described. The third invention relates to a magnetic field generator for magnetron plasma generation which comprises a dipole-ring magnet with a plurality of columnar anisotropic segment magnets arranged in a ring-like manner, and features that at least one magnet field control (adjusting) means, which is used to control the direction of the magnetic field relative to the wafer surface to be etched, is provided in the vicinity of the upper end of the dipole-ring magnet and/or inside the dipole-ring magnet.

A first embodiment of the third invention will be discussed by referring to FIGS. 9 to 13. According to the first embodiment, the ring-like or disk-like magnet 80, which is magnetized such as to have two poles, is provided or installed in the vicinity of the upper end of the dipole-ring magnet 35. In this instance, it is preferable to provide the ring-like magnet 80 at a position above the plate-like electrode 36 in order not to disturb the electric field generated between the plate-like electrodes 36 and 37.

It may be further preferable to provide the ring-like magnet 80 at the position above half the length of the first dipole-ring magnet even if the plate-like electrode 36 can be positioned lower than half the length of the first dipole-ring magnet. The magnetized direction of the ring-like magnet 80 is such as to be perpendicular to the horizontal magnetic field generated by the dipole-ring magnet 35. Furthermore, the border line (denoted by 82 in FIGS. 9 and 10), at which the magnetized direction is reversed, is normal to the magnetic field of the dipole-ring magnet. That is, the magnetized direction of the ring-like magnet 80 is perpendicular to the direction of the magnetic field in the vicinity of the central portion of the dipole-ring magnet 35.

Hereinafter, the ring-like magnet 80 will be described in more detail. As illustrated in FIG. 10(a), one half of the ring-like magnet 80, which is divided at a plane including the central axis 84 (whose direction is perpendicular to the paper) of the ring-like magnet 80, has been magnetized in a first direction. On the other hand, the other half of the ring-like magnet 80 has been magnetized in the direction opposite to the first direction.

By way of example, the ring-like magnet 80 is constructed such that two semicircular ring-like members 80a and 80b are respectively magnetized in the direction of thickness, after which the two semicircular ring-like members 80a and 80b are combined together using adhesive and so on such that the magnetized directions of 80a and 80b become opposite with each other. The semicircular ring-like members 80a and 80b may be assembled by direct contacting them, and as an alternative, the members 80a and 80b may be combined with a non-magnetic thin film thin therebetween.

In addition, the ring-like magnet may be configured, as shown in FIG. 10(b), by using a plurality of square small magnets arranged in a ring-like manner. The ring-like magnet thus configured is denoted by reference numeral 86. In the case where the apparatus becomes larger in size, the ring-like magnet shown in FIG. 10(b) is preferable in view of the manufacturing cost reduction. In FIG. 10(b), supports or bases 89a and 89b in which the plurality of small sized magnets are embedded or provided, are each made of non-magnetic material, and the supports 89a and 89b may be each rectangle as shown in the figure or may be semicircular. It goes without saying that the cross section of each of the small sized magnets is not limited to square, and may be rectangular, triangular, circular, etc. In addition, if the ring-like magnets 80 and 86 are respectively rendered rotatable (at least 180°) around the central axes thereof, the features set forth below can be obtained.

The ring-like magnet 80 is provided or installed such that the central axis 84 thereof is exactly or approximately in coincidence with the central axis of the dipole ring magnet 35. Further, the diameter of the ring-like magnet 80 is smaller than the inner diameter of the dipole-ring magnet 35. The reason thereof is that the ring-like magnet 80 should be provided inside the dipole-ring magnet 35.

Figure 11:
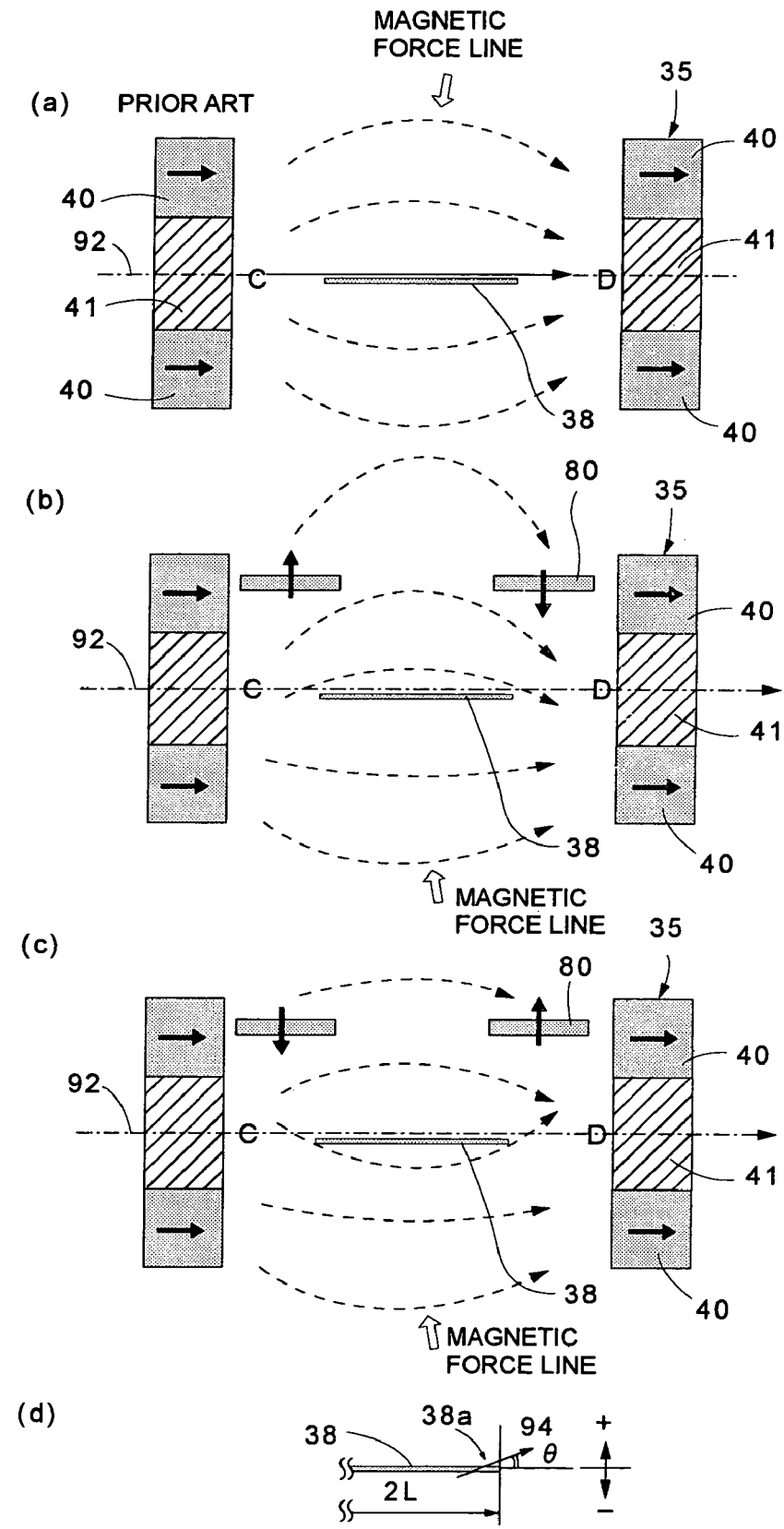
FIG. 11 is a diagram for use in comparing the lines of magnetic force (magnetic field) generated by the known magnetic field generator for magnetron plasma generation, and the lines of magnetic force (magnetic field) generated by the magnetic field generator for magnetron plasma generation according to the embodiment of the third invention shown in FIG. 9.

There will be described, with reference to FIG. 11, a difference between the two kinds of magnetic fields wherein one is generated by the conventional dipole ring magnet 35 and the other is generated according to the first embodiment of the third invention.

FIG. 11(a) shows the line of magnetic force in the cross section taken along the line A-B of the conventional dipole-ring magnet 35 (FIG. 31). A broken line horizontally (laterally) extending is included in the central cross section C-D perpendicular to the lengthwise direction of the dipole-ring magnet 35. As mentioned above, the line of magnetic force is substantially horizontal (viz., normal to the central axis) within the cross-section C-D. However, the extent that the magnetic force line curves become large as it goes toward the end of the dipole-ring magnet 35 along the central axis thereof.

On the other hand, FIG. 11(b) shows the line of magnetic force in the cross section A-B (FIG. 9) when the ring-like magnet 80 according to the first embodiment of the third invention is applied to the conventional dipole-ring magnet 35. As is clear from FIG. 11(b), the two-pole magnetized ring-like magnet 80, which is provided in the vicinity of the upper end of the dipole-ring magnet 35, is such as to generate downward magnetic field at the right hand in the drawing and upward magnetic field at the left hand, and as such, the magnetic force line in the vicinity of the central cross section C-D is in the up-to-down direction. Furthermore, as shown in FIG. 11(c), if the ring-like magnet 80 is rotated by 180° around the central axis thereof, then the magnetic force line in the vicinity of the central cross section C-D is in turn in the down-to-up direction.

By the way, the effect which the ring-like magnet 80 has on the line of magnetic force near the central cross section of the dipole-ring magnet 35 varies depending on the distance Z (see FIG. 9) from the central cross section C-D to the ring-like magnet 80. That is, the manner of bending or curving the line of magnetic force (viz., the direction of the magnetic field) near the central cross section C-D of the dipole-ring magnet 35 is controllable by way of adjusting the distance Z. FIG. 11(d) is provided to define the direction θ of the magnetic field at the end of the wafer as in the first invention.

The inventors conducted the experiments so as to check to determine, under the aforesaid four conditions 1-4, a relationship between the angle θ of the magnetic field at the wafer edge 38a and the uniformity of etch rate on (across) the wafer surface with respect to the etched material by changing the distance Z from the central cross section C-D to the ring-like magnet 80. These experiments revealed that the same results as those referred to by referring to FIGS. 4 to 7 were obtained.

In the foregoing, a single ring-like magnet 80 is employed. However, as an alternative, it is possible to use a plurality of ring-like magnets which are arranged in an overlapping manner in the direction of the central axis (viz., lengthwise axis) of the dipole-ring magnet.

Figure 12:
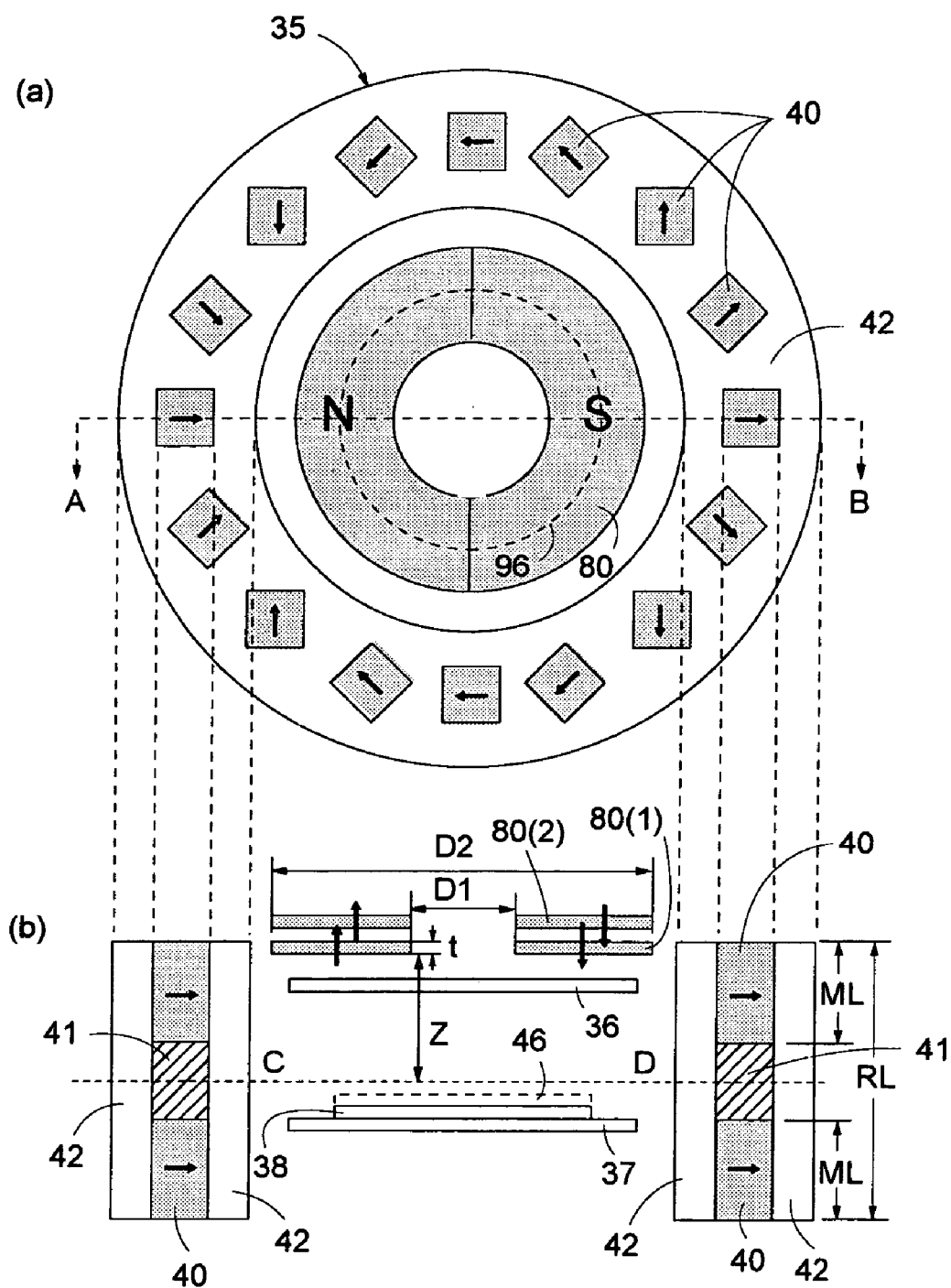
FIG. 12 is a diagram showing the modification of the magnetic field generator for magnetron plasma generation according to the embodiment of the third invention shown in FIG. 9.
Figure 14:
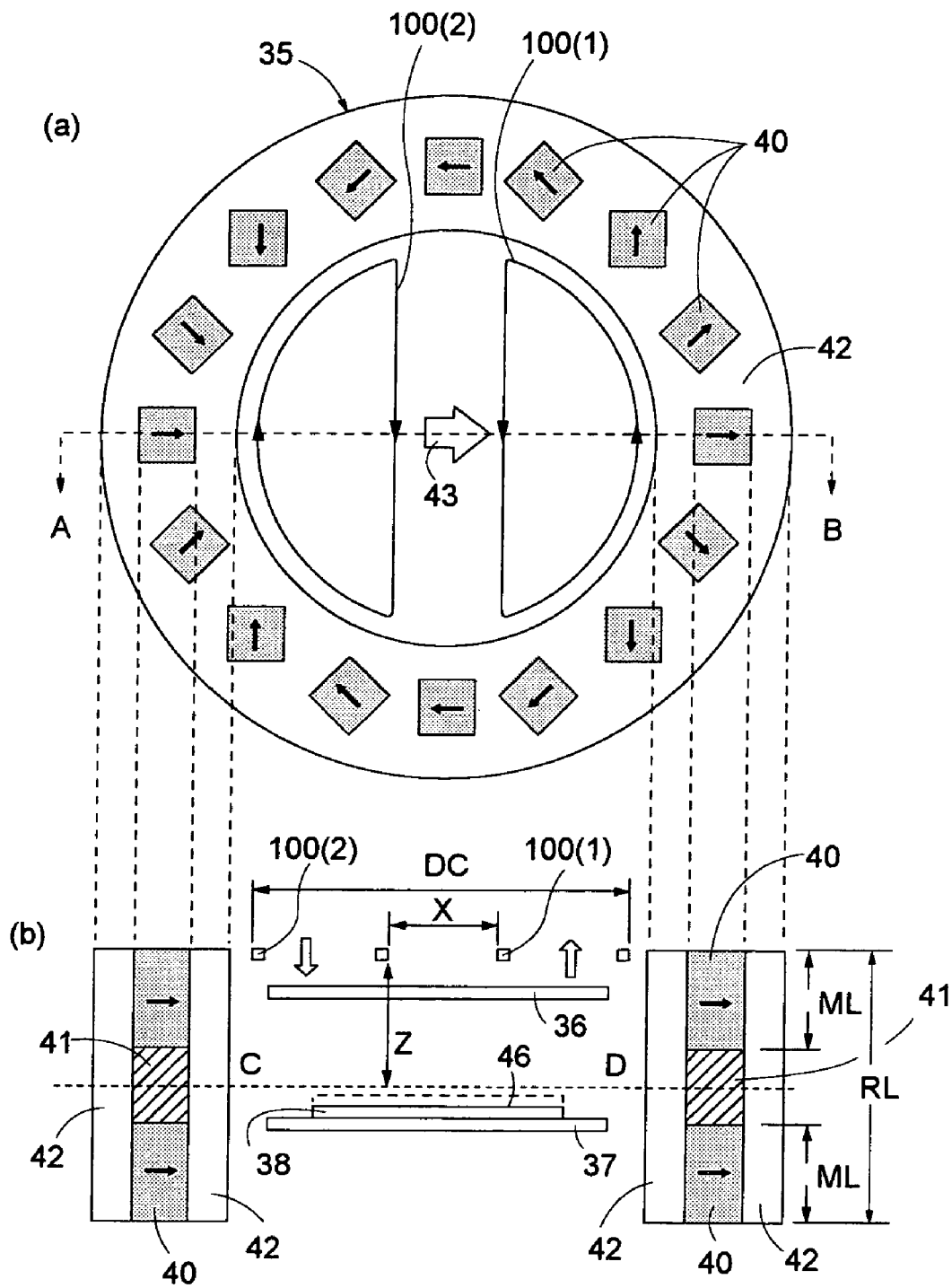
FIG. 14 is a diagram for use in describing the magnetic field generator for magnetron plasma generation according to the embodiment of the third invention.

FIG. 12 is a drawing for use in describing the case where two ring-like magnets are used which are respectively denoted by 80 (1) and 80 (2). FIG. 12 is identical to FIG. 9 except that the two ring-like magnets are used in FIG. 12. The ring-like magnets 80 (1) and 80 (2) are respectively rotatable around the central axes thereof, and accordingly are able to increase the effect thereof on the magnetic field control or cancel the same by rotation by 180°.

FIG. 13(a) illustrates the case where the two ring-like magnets 80 (1) and 80 (2) are arranged such that the magnetized directions thereof are identical with each other. This case corresponds to the case shown in FIG. 11(b), but, it is possible to accelerate the effects imparted on the magnetic force lines at or in the vicinity of the central cross section C-D of the dipole-ring magnet 35. Accordingly, in the case where the angle θ of the direction of the magnetic field at the edge of the wafer 38a is to be increased in the negative direction, if the two ring-like magnets are used, it is possible to shorten the traveling distance thereof compared with the case where a single ring-like magnet is used. On the other hand, although not illustrated in FIG. 13, the ring-like magnet 80 (1) and 80 (2) are rotated such that the directions of magnetic force lines of these magnets can be reversed with respect to the case shown in FIG. 13(a) (which corresponds to the case of FIG. 11(c)).

FIG. 13(b) shows the case where only the ring-like magnets 80(2) is rotated by 180° from the position shown in of FIG. 13(a), in the case of which the directions of the two ring-like magnets 80(1) and 80(2) are opposite with each other. In the instant case, if the strengths of the two ring-like motets are equal, these ring-like magnets have no longer their effects on the magnetic force lines in the vicinity of the central cross section C-D of the dipole-ring magnet 35. That is, it is possible to make approximately zero the angle θ in the vicinity of the central cross section C-D. There may exist the case where the angle θ near the central cross section C-D should be rendered approximately zero depending on an etching condition(s). Accordingly, if the ring-like magnets 80 (1) and 80 (2) are rotatable as mentioned above, it is possible to address the difficulties of removing the ring-like magnet or keeping the same to the position where the ring-like magnet has no influence on the magnetic force lines in the vicinity of the central cross section C-D.

Furthermore, it is also possible to increase the number of ring-like magnets more than two. FIG. 13(c) shows the case where the number of the ring-like magnets is increased up to four. In this way, if the ring-like magnets are increased in number and are respectively made rotatable, it becomes possible to control finely and sharply the effects of the combined ring-like magnets on the magnetic force lines in the vicinity of the central cross section C-D of the dipole-ring magnet 35. The aforesaid techniques are especially effective when it is desirable to shorten the traveling range of the distance of Z, or when it is desirable to extensively increase the angle θ of the magnetic field at the wafer edge.

Some concrete examples according to the first embodiment of the third invention will be describe. According to the experiments conducted by the inventors, the length RL of the dipole-ring magnet was set to 165 mm. Further, each of the anisotropic segment magnets 40, whose number was 16 in total, was an Nd—Fe—B based magnet, having a 60 mm by 60 mm square cross section. The upper and lower segment magnets 40, which sandwiched the space 41, had respectively a length ML of 37.5 mm, and the spacer 41 had a length of 90 mm. Two ring-like magnets were used, each of which had an outer diameter D2 of 525 mm and a thickness of 1.5 mm. The two ring-like magnets were separated by a distance D1 of 150 mm. As shown in FIG. 13(a), two ring-like magnets were arranged so that the magnetized directions thereof are identical with each other. When the distance Z from the central cross section C-D to the ring-like magnet 80 (1) was set to 112.5 mm, the direction θ of the magnetic field at the end 38a of the wafer near the central cross section C-D of the dipole-ring magnet 35 became 22°. From this situation, when the two ring-like magnets 80 (1) and 80 (2) are lifted up to Z=262.5 mm, the angle θ became 5°.

On the other hand, when only the ring-like magnet 80(2) was rotated by 180°, as in the case from the situation of FIG. 13(*a*) to the situation of 13(*b*), so as to oppose the magnetized directions of the ring-like magnets 80(1) and 80(2), then angle θ became zero. Further, the ring-like magnets 80 (1) and 80(2) were both rotated by 180° from their situations shown in FIG. 13(*a*) so that the magnetized directions of the magnetic 80(1) and 80(2) became opposite to the situations shown in FIG. 13(*a*). In this instance, when Z=112.5 mm, the angle θ became −22°, and when Z=262.5 mm, the angle θ became −5°. Therefore, it was found that when the two ring-like magnets 80 (1) and 80(2) were moved together from Z=112.5 mm to 262.5 mm, and at the same time, the ring-like magnets were rotated, the angle θ were able to be changed from −22° to −5°, and changed to 0°, and changed from 5° to 22°.

In the following, the second embodiment of the third invention will be described with reference to FIGS. 9 and 10. The second embodiment is that the ring-like magnet of the first embodiment is replaced by two coils (viz., electromagnets) 100(1) and 100(2) each of which is wound in the shape of a semicircle. Other than this, the second embodiment is identical to the first embodiment.

Figure 9:
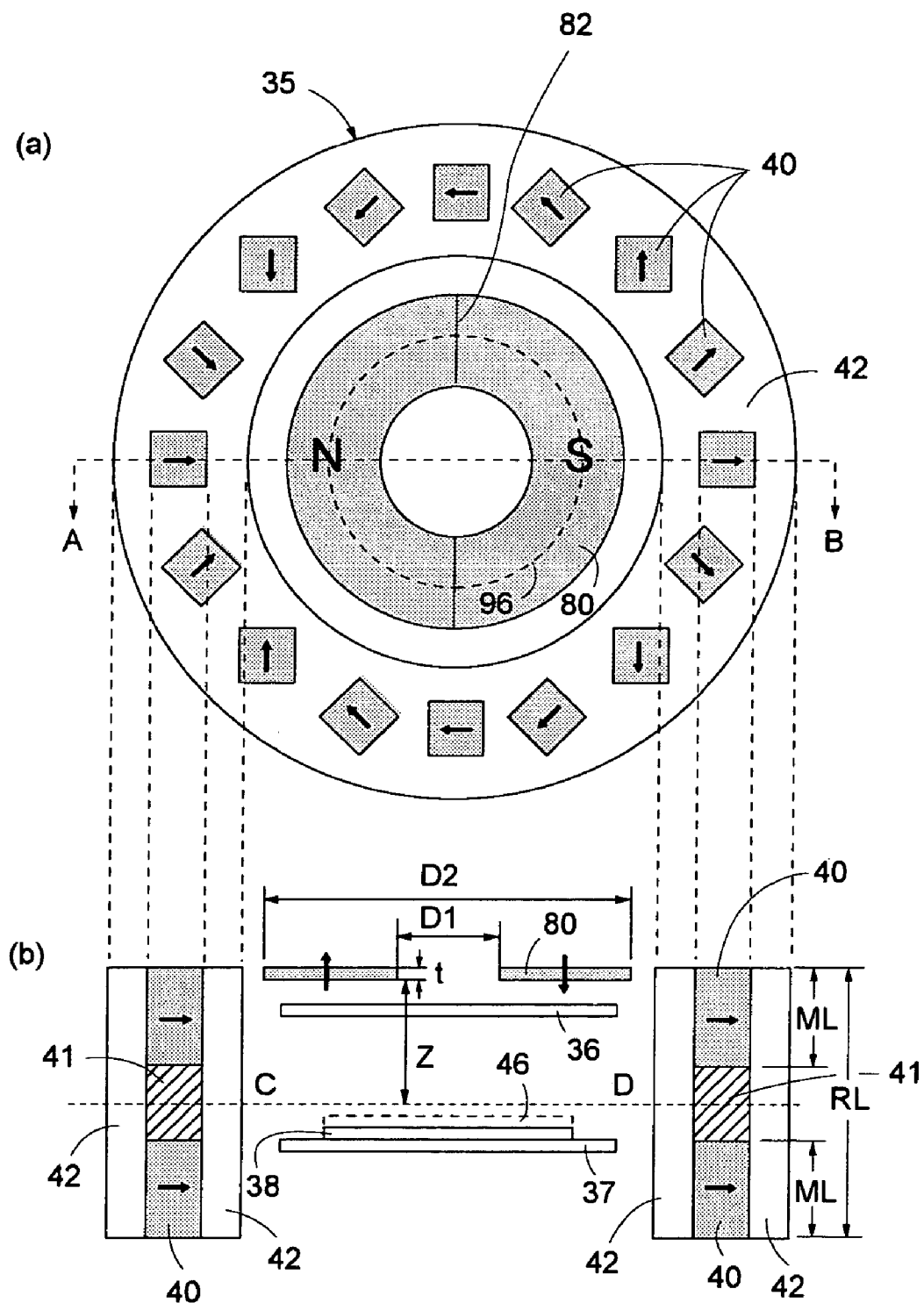
FIG. 9 is a diagram for describing the magnetic field generator for magnetron plasma generation according to the embodiment of the third invention.
Figure 10:
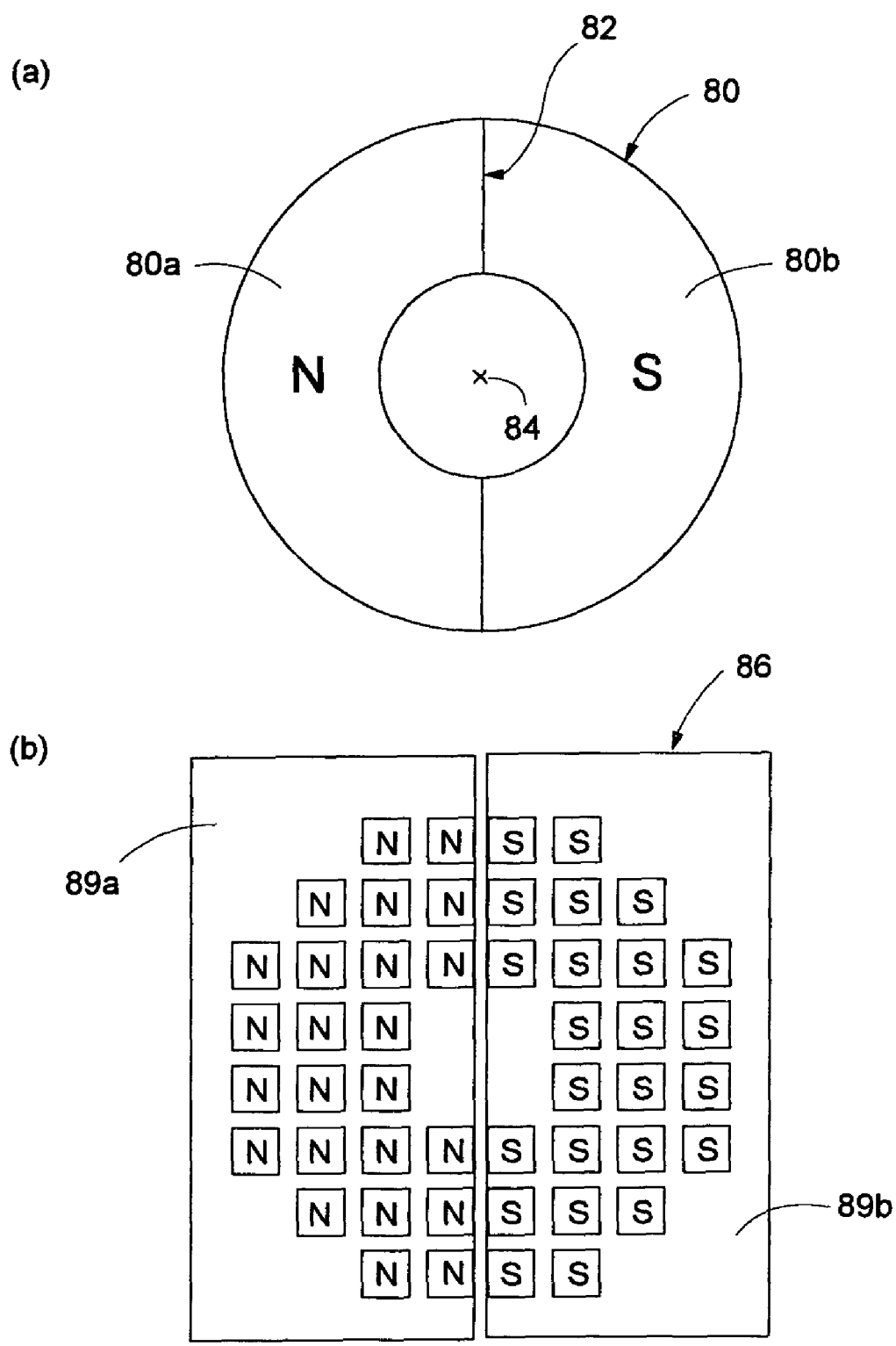
FIG. 10 is a diagram showing a ring-like magnet used for the magnetic field generator for magnetron plasma generation according to the embodiment of the third invention shown in FIG. 9.

The coils 100 (1) and 100(2) are symmetrical in terms of configuration with respect to a line which corresponds to the border line 82 between the two semicircle magnets of FIGS. 9 and 10, which line is perpendicular to the direction of the magnetic field generated by the dipole-ring magnet 35. As is understood from the first embodiment, the directions of the magnetic fields generated by the coils 100(1) and 100(2) should be opposite with each other, and as such, the currents flowing through the coils 100 (1) and 100 (2) should be opposite. According to the second embodiment of the third invention, the intensity of the magnetic field generated by the coils can be adjusted by controlling the currents flowing through the coils, and thus, it is possible to control the angle θ of the magnetic field at the end of the wafer in the vicinity of the central cross section C-D of the dipole-ring magnet 35.

The concrete example of the second embodiment of the third invention will be described. According to the experiments conducted by the inventors, the length RL of the dipole-ring magnet was set to 165 mm. Further, each of the anisotropic segment magnets 40, whose number was 16 in total, was an Nd—Fe—B based magnet, having a 60 mm by 60 mm square cross section. The upper and lower segment magnets 40, which sandwiched the space 41, had respectively a length ML of 37.5 mm, and the spacer 41 had a length of 90 mm. A distance DC (see FIG. 14), which corresponds to a diameter of a vertical circle formed by the two coils 100(1) and 100(2), was set to 75 mm. The two coils were wound in the directions shown in FIG. 14 with the number of turns of each coil being 100. When the distance Z from the central cross section C-D to the coil was set to 112.5 mm, the angle θ of the magnetic field at the wafer end 38a in the vicinity of the central cross section C-D of the dipole-ring magnet 35, was changed by controlling the current flowing through the coils. When a current of 10A was supplied to the coils 100(1) and 100(2) in the directions opposite to those shown in FIG. 14, the angle θ became −12°, and when no current flew through the coils, the angle θ became zero. Further, when a current of 10A was supplied to the coils 100(1) and 100(2) in the directions shown in FIG. 14, the angle θ became 12°.

Figure 15:
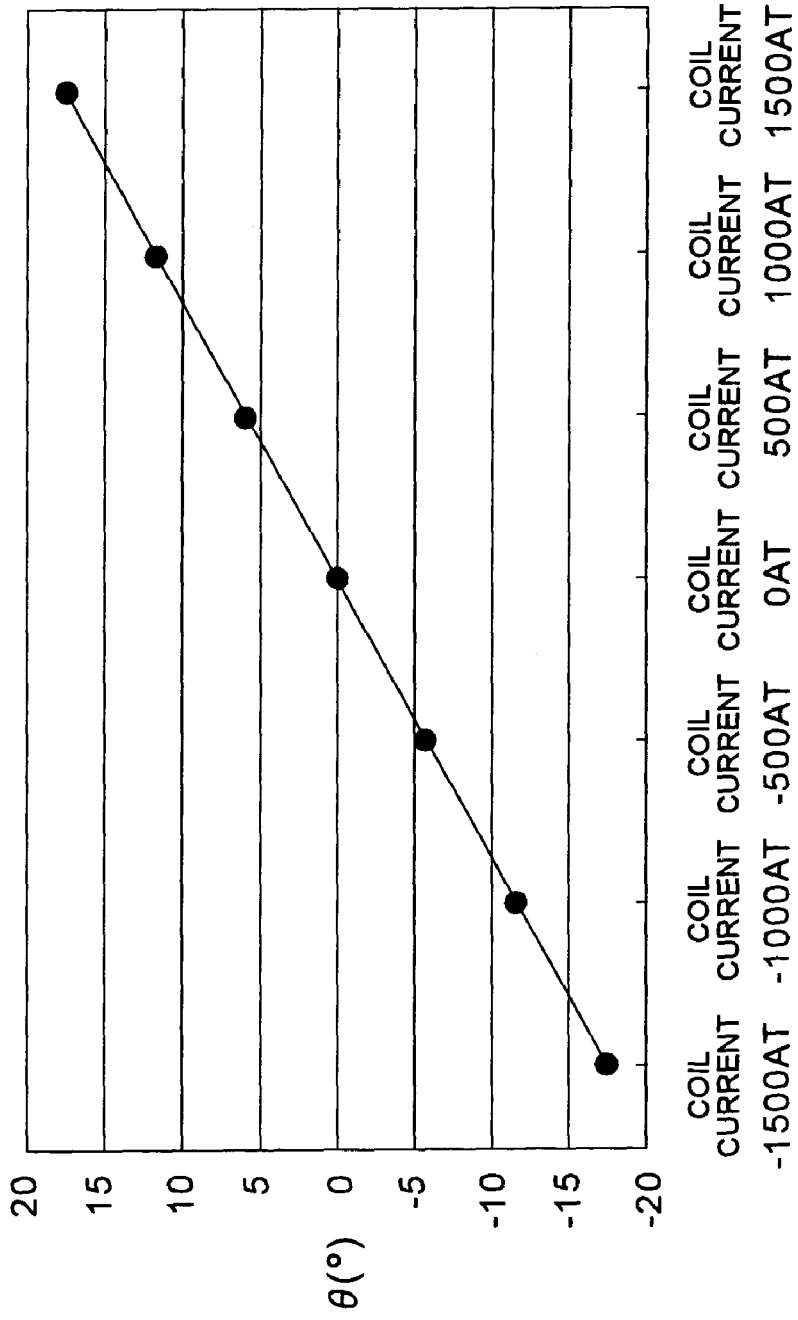
FIG. 15 is a diagram illustrating the change of the magnetic field angle at the wafer edge when changing the amount of current flowing through a coil in connection with the magnetic field generator for magnetron plasma generation according to the embodiment of the third invention shown in FIG. 14.

As mentioned above, it is possible to control the angle θ by controlling the current flowing through the coils. FIG. 15 is a graph showing that the angle θ of the magnetic field at the wafer edge 38a provided in the vicinity of the central cross section C-D of the dipole-ring magnet 35 is controlled by changing the ampere-turn of the coils 100(1) and 100(2).

Figure 16:
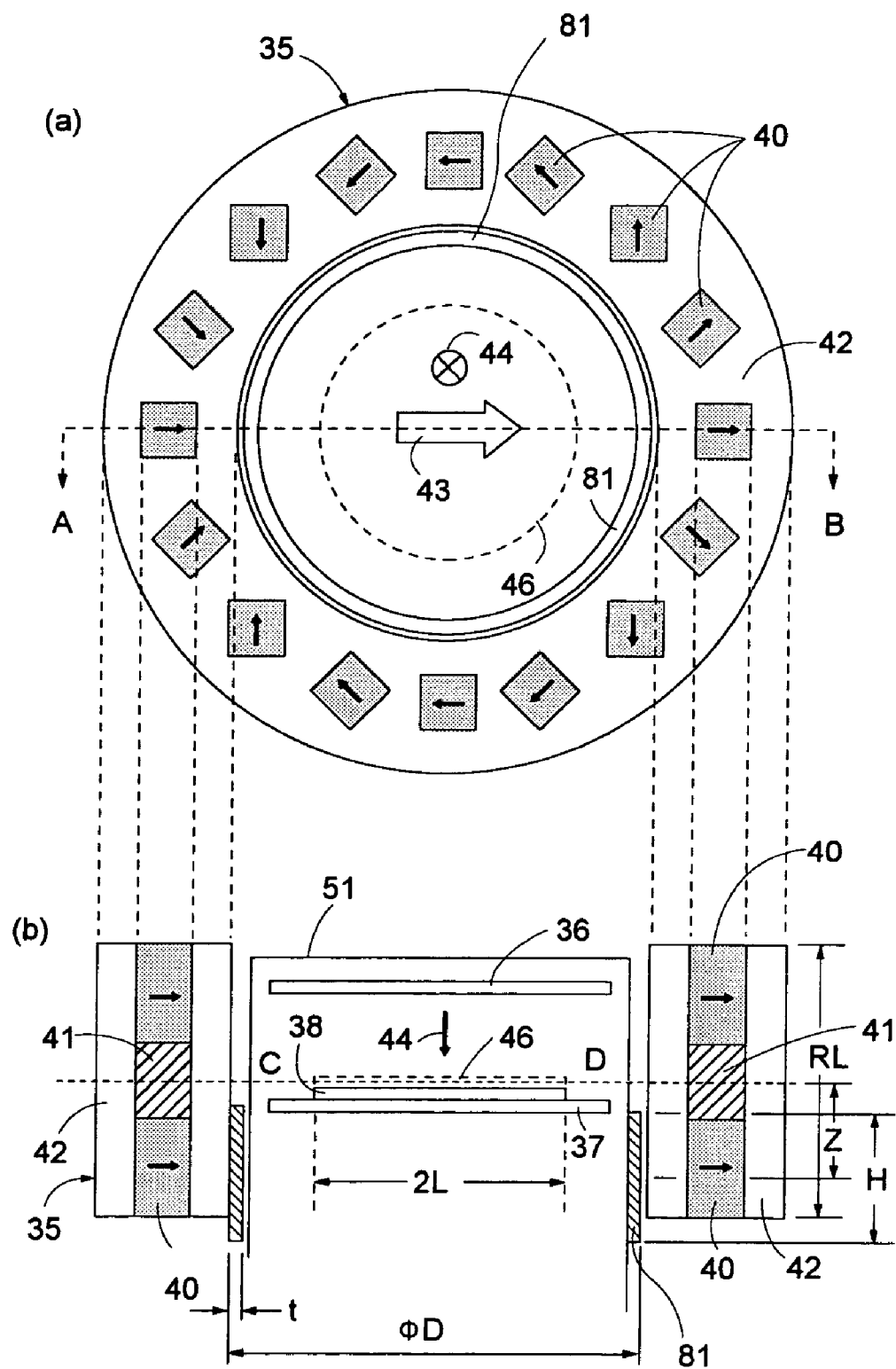
FIG. 16 is a diagram for use in describing the magnetic field generator for magnetron plasma generation according to the embodiment of a fourth invention.

The fourth invention will be described with reference to FIGS. 16 to 18. According to the fourth invention, a magnetic ring 81 made of iron (for example) is provided, as shown in FIG. 16, inside the conventional dipole-ring of FIG. 31. The magnetic ring 81 is arranged such as to be movable up and down thereby to control the angle θ of the magnetic field at the end of the wafer in the vicinity of the central cross section C-D of the dipole-ring magnet 35. As shown in FIG. 16, the magnetic ring 81 is positioned between a processing chamber 51 for etching (for example) provided inside the dipole-ring magnet 35 and the inner wall of the dipole-ring magnet 35.

As mentioned above, the fourth invention shown in FIG. 16 is such that the magnetic ring 81 is installed in the conventional dipole-ring magnet, and as such, the description of FIG. 16 will be omitted for the sake of simplifying the description of the instant disclosure.

There will be described, with reference to FIG. 17, a difference between the two kinds of magnetic fields wherein one is generated by the conventional dipole-ring magnet 35 and the other is generated using the fourth invention. FIG. 17(*a*) shows the line of magnetic force in the cross section taken along the line A-B of the conventional dipole-ring magnet 35 (FIG. 31). A broken line 92 horizontally (laterally) extending is included in the central cross section C-D perpendicular to the direction of length of the dipole-ring magnet 35. As mentioned above, the line of magnetic force is substantially horizontal (viz., normal to the central axis). However, the extent that the magnetic force line curves become larger as it goes along the central axis of the dipole-ring magnet 35 toward the end thereof.

Figure 17:
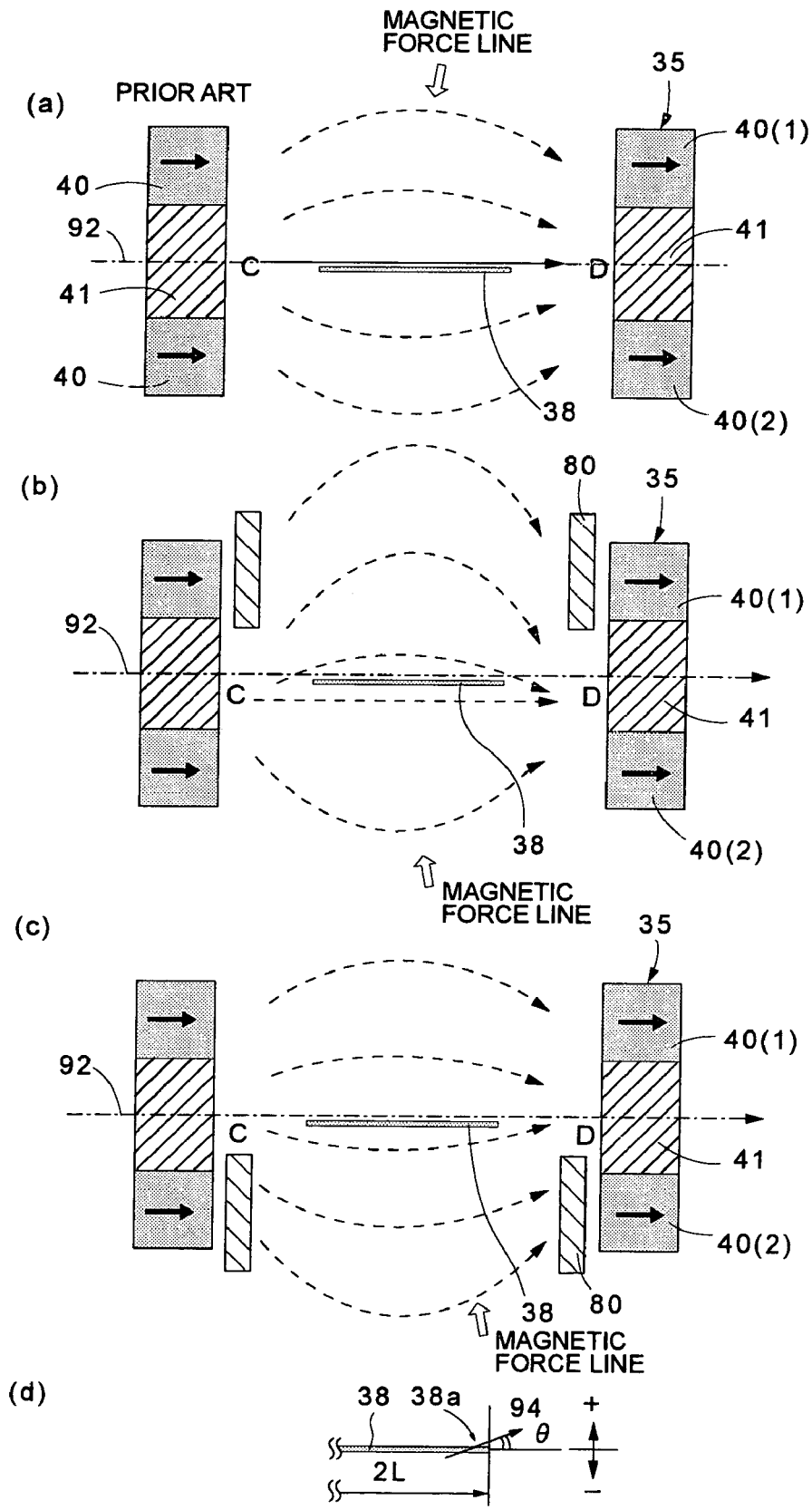
FIG. 17 is a diagram for comparing the lines of magnetic force (magnetic field) generated by the known magnetic field generator for magnetron plasma generation, and the lines of magnetic force (magnetic field) generated by the magnetic field generator for magnetron plasma generation according to the embodiment of the fourth invention.

On the other hand, FIG. 17(*b*) shows the line of magnetic force in the cross section A-B (FIG. 16) when the magnetic ring 81 according to the fourth invention is used.

As is shown in FIG. 17(*b*), when the magnetic ring 81 is moved upward inside the dipole-ring magnet 35, the magnetic flux density of the upper segment magnet 40(1) of the dipole-ring magnet 35 is lowered, and hence the line of the magnetic force becomes in the up-to-down direction.

On the other hand, as shown in FIG. 17(*c*), contrary to the above case, when the magnetic ring 81 is moved downward inside the dipole-ring magnet 35, the magnetic flux density of the lower segment magnet 40(2) is lowered, and as such, the line of the magnetic force near the central cross section C-D of the dipole-ring magnet is in the down-to-up direction. FIG. 11(*d*) is provided to define the direction θ of the magnetic field 94 at the end of the wafer 38 as in FIGS. 3 and 11(*d*).

Thus, the direction of the line of magnetic force (viz., the direction of the magnetic field) in the vicinity of the central cross section C-D of the dipole-ring magnet can be controlled by moving the magnetic ring 81 up and down.

In the above, it is preferable that the length H (see FIG. 16) of the magnetic ring 81 is less than half the length RL of the dipole-ring magnet. The reason thereof is that when the direction of the magnetic force in the vicinity of the central cross section C-D of the dipole-ring ring magnet is controlled by moving the magnetic ring 81 up and down, if the magnetic ring 81 is positioned inside both of the upper and lower segment magnets 40(1) and 40(2), the magnetic flux densities of both of the upper and lower segment magnets are lowered, leading to the fact that it becomes very difficult to change the magnetic force lines in the vicinity of the cross section C-D.

The practical examples according to the embodiment of the fourth invention will be described. According to the experiments conducted by the inventors, the length RL of the dipole-ring magnet was set to 165 mm. Further, each of the anisotropic segment magnets 40 whose number was 16 in total, was an Nd—Fe—B based magnet, having a 60 mm by 60 mm square cross section. The upper and lower segment magnets 40, which sandwiched the space 41, had respectively a length ML of 37.5 mm, and the spacer 41 had a length of 90 mm. Furthermore, when the magnetic ring had an outer diameter D of 540 mm, a thickness t of 7.5 mm, a height H of 75 mm, and a distance Z, which was measured downward from the central cross section C-D, of 75 mm (when the position Z at the center cross section C-D was set to zero then Z=−75 mm), the angle θ of the magnetic field 94 at the wafer edge 38a in the vicinity of the central cross section C-D became 12°. On the other hand, when Z=0 mm, the angle θ was zero, and when Z=75 mm, the angle θ became −12°. Further, the angel θ was able to be controlled between −12° and 12° when the magnetic ring 81 was moved between −75 mm and 75 mm.

Figure 18:
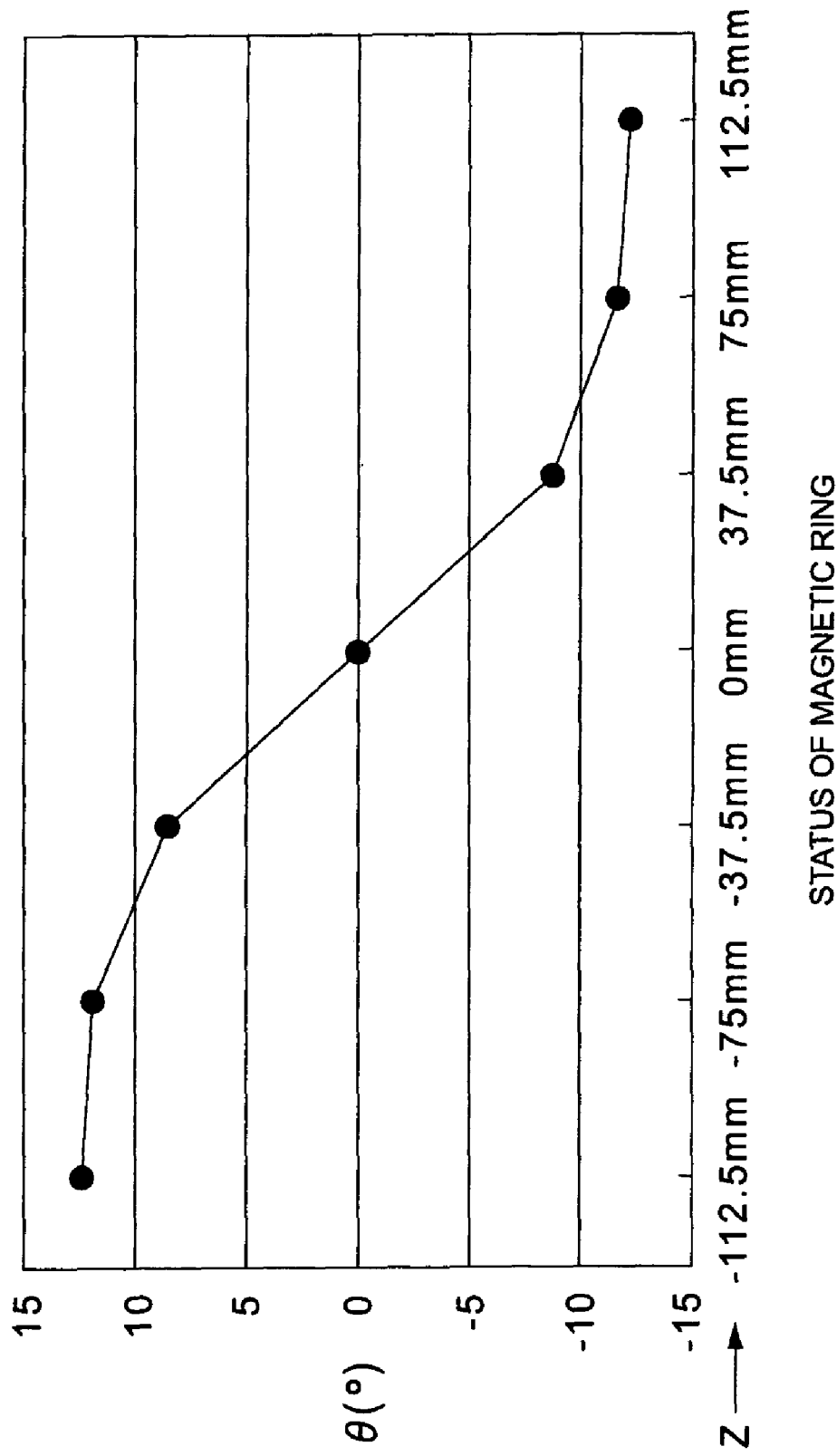
FIG. 18 is a diagram illustrating the change of the magnetic field angle at the wafer edge when displacing a ring of magnetic material in the magnetic field generator for magnetron plasma generation according to the embodiment of the fourth invention.

FIG. 18 is a graph showing the angle θ of the magnetic field at the wafer edge 38a in the vicinity of the central cross section C-D of the dipole-ring magnet 35, when the magnetic ring 81 was moved up and down. That is to say, it is understood that the angle θ is controllable by moving the magnetic ring 81.

The inventors conducted the experiments so as to check to determine the relationship between the magnetic field angle θ at the wafer edge 38a and the uniformity of etch rate of the material to be etched under the above-mentioned process conditions 1 to 4, when the magnetic ring 81 was moved up and down inside the dipole-ring magnet 35. According to these experiments, the same result as described with reference to FIGS. 4 to 7 were obtained.

The fifth invention will be described with reference to FIGS. 19 to 22. The fifth invention will be described with reference to FIGS. 19 to 22. According to the fifth invention, the conventional dipole-ring magnet shown in FIG. 31 is divided into two in the direction perpendicular to the central axis thereof, and one of the divided two parts is arranged such as to be movable in the lengthwise direction of the dipole-ring magnet, thereby to control the magnetic field angle θ at the end 38a of the wafer set in the vicinity of the central cross section of the dipole-ring magnet. As mentioned above, if the magnetic field angle at the wafer end 38a is controlled, the magnetic field strength in the other edge of the wafer is also controllable.

Figure 19:
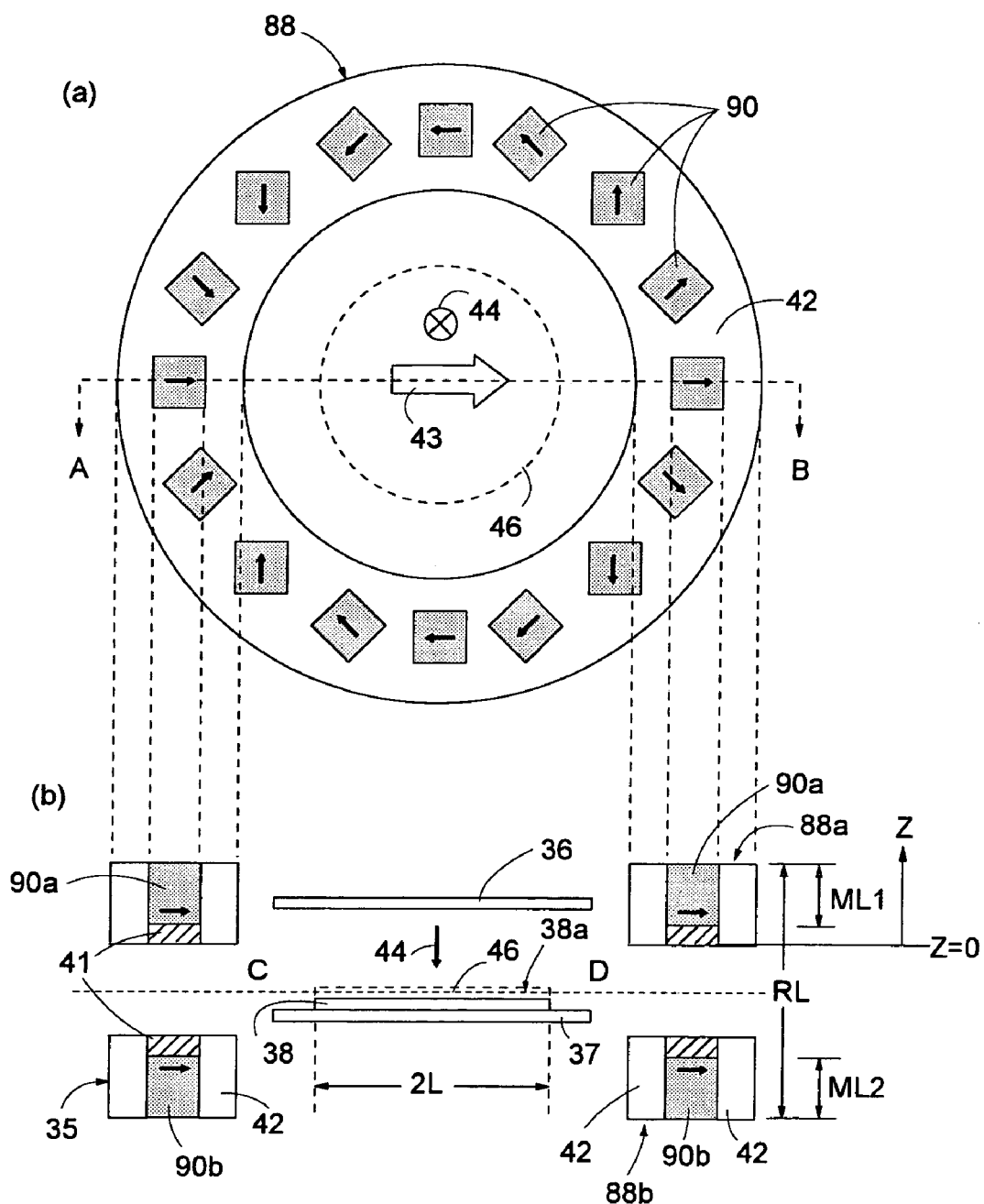
FIG. 19 is a diagram for use in describing a magnetic field generator for magnetron plasma generation according to the embodiment of a fifth invention.

FIG. 19 shows one embodiment of the magnetic field generator for magnetron plasma generation according to the fifth invention. As shown in FIG. 19, the dipole-ring magnet 88 is comprised of upper and lower dipole-ring magnets 88a and 88b arranged in the direction of the central axis of the magnet 88. These dipole-ring magnets 88a and 88b are spaced apart by a predetermined interval The dipole-ring magnet 88a (for example) is arranged to be movable in the direction of the central axis thereof.

Figure 20:
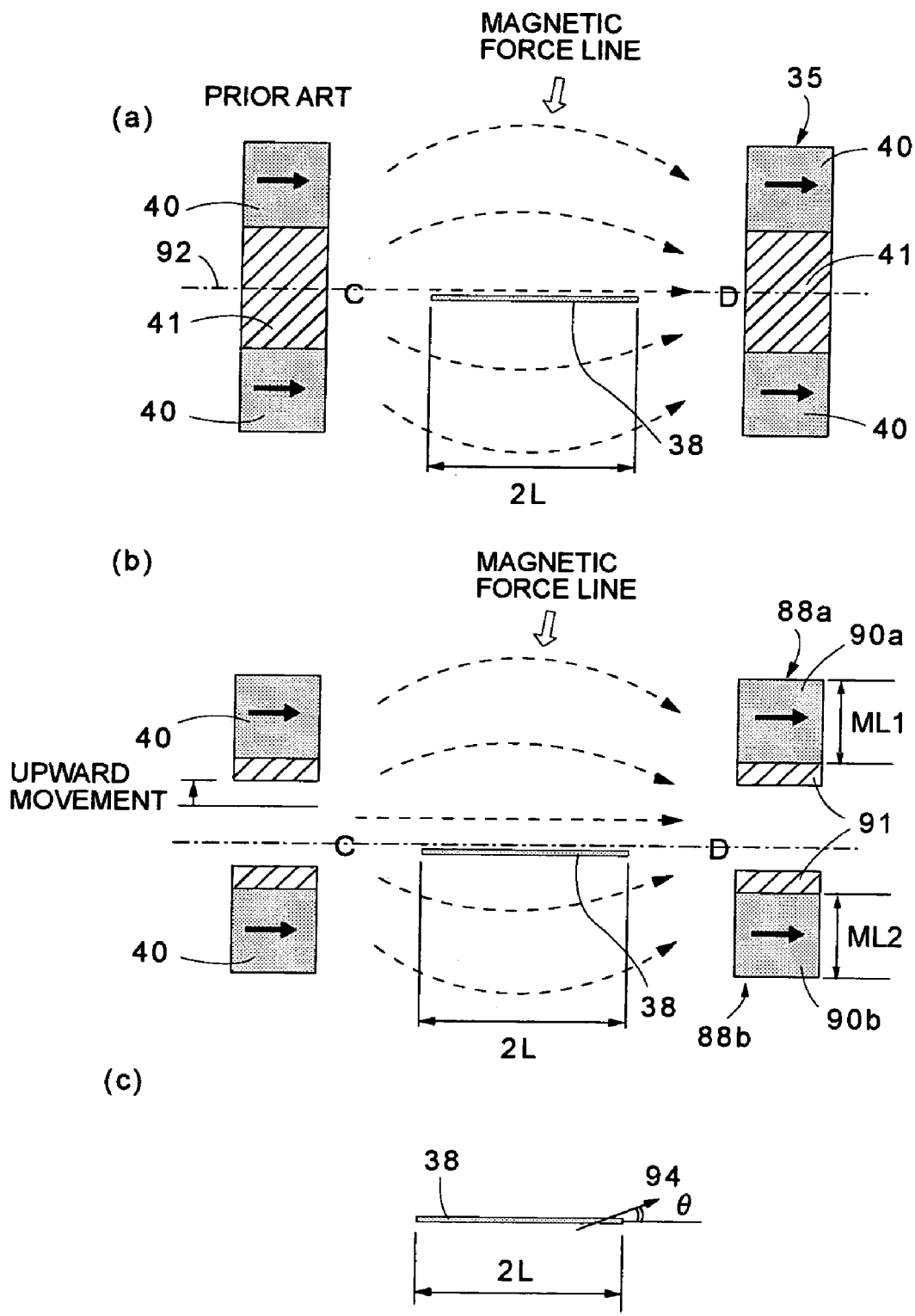
FIG. 20 is a diagram for comparing the lines of magnetic force (magnetic field) generated by the known magnetic field generator for magnetron plasma generation, and the lines of magnetic force (magnetic field) generated by the magnetic field generator for magnetron plasma generation according to the embodiment of the fifth invention.
Figure 25:
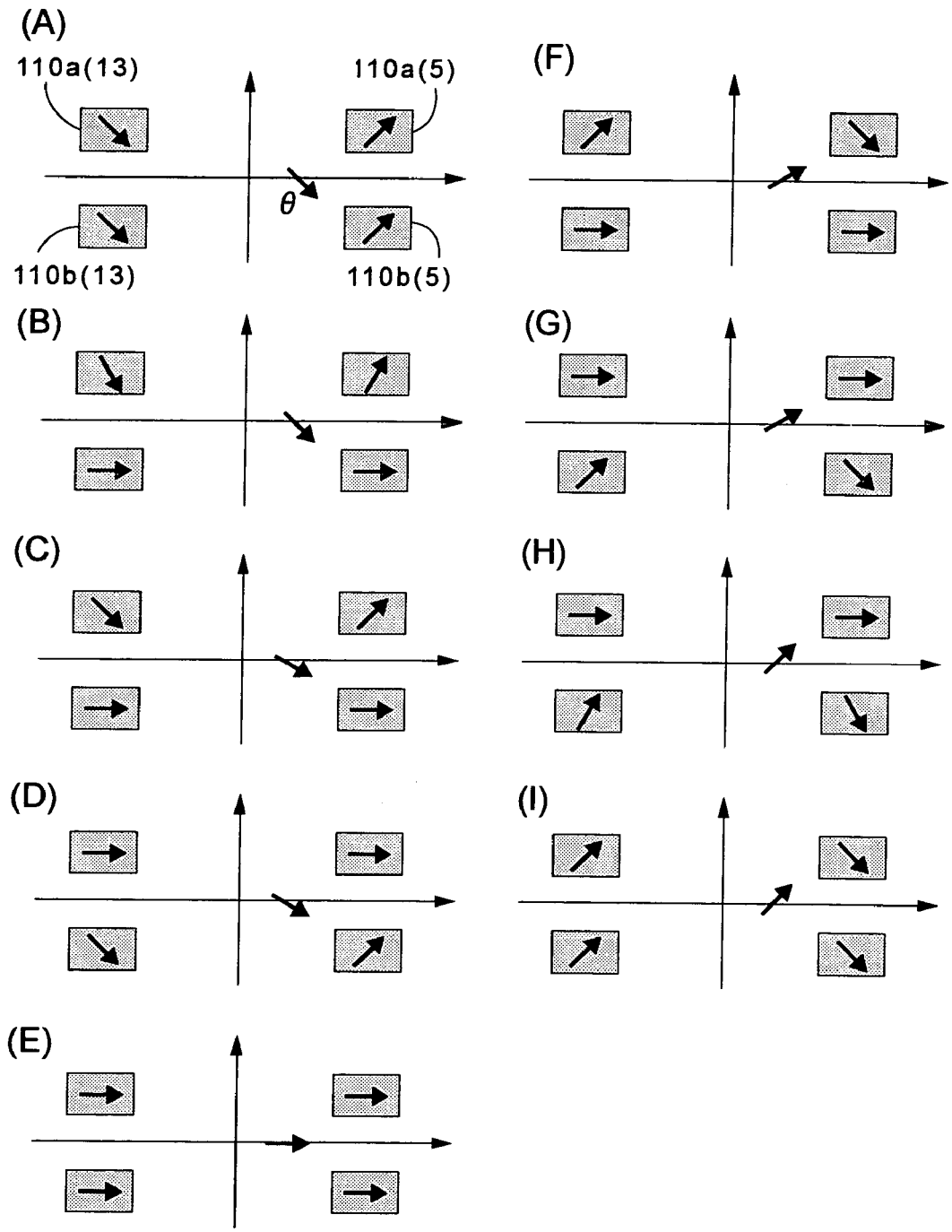
FIG. 25 is a graph showing the changes of the magnetic field angle $\theta$ at the wafer edge when changing the magnetized direction of the segment magnet which constitutes the dipole-ring magnet in connection with the embodiment of the sixth invention.

The fifth invention will further be described with reference to FIG. 20. FIG. 20(a) corresponds to FIG. 3(a), and, as already described, illustrates the lines of magnetic force in the A-B cross section of the conventional dipole-ring magnet 35 (FIG. 25). A broken line 92 extending in the horizontal direction is included in the central cross section C-D perpendicular to the lengthwise direction of the dipole-ring magnet 35. Although the magnetic force line in this portion is approximately in parallel with the direction normal to the central axis of the dipole-ring magnet 35, the extent of the curve or bend of the magnetic force line becomes large as it goes toward the end of the dipole-ring magnet 35 along the central axis thereof.

FIG. 20(b) shows the manner of the magnetic force lines in the A-B cross section of the dipole-ring magnet 88 in the case where the upper dipole-ring magnet 88a is moved upward from the initial or original position shown in FIG. 19. That is, if the upper dipole-ring magnet 88a is moved upward from the initial position, the center of the dipole-ring magnet 88 moves upward, and as such, the direction of the magnetic force line in the original central cross section C-D of the dipole-ring magnet 88 become down-to-up. As described with reference to the first to fourth inventions, the angle θ of the magnetic force line 94 at the wafer edge 38 is defined as shown in FIG. 20(c).

Some concrete examples of the fourth invention will be discussed below. According to the experiment conducted by the inventors, the length RL of the dipole-ring magnet was set to 165 mm. Further, each of the anisotropic segment magnets 40 whose number was 16 in total, was an Nd—Fe—B based magnet (Br=1.3 Tesla), having a 37.5 mm by 37.5 mm square cross section, and the length of the spacer 91 was 15 mm. The upper and lower segment magnets 90a and 90b, which contacted the spacer 91, had lengths ML1 and ML2 each of which was 75 mm. When the upper dipole-ring magnet 88a is moved upward 112.5 mm (viz., Z=112.5 mm) from the initial location thereof (Z=0) shown in FIG. 19, the direction θ (viz., angle of the magnetic field) of the magnetic force line 94 at the end 38a of the wafer in the vicinity of the central cross section C-D of the dipole-ring magnet 88 shown in FIG. 19, was able to be changed from 0° to about 7°.

Figure 21:
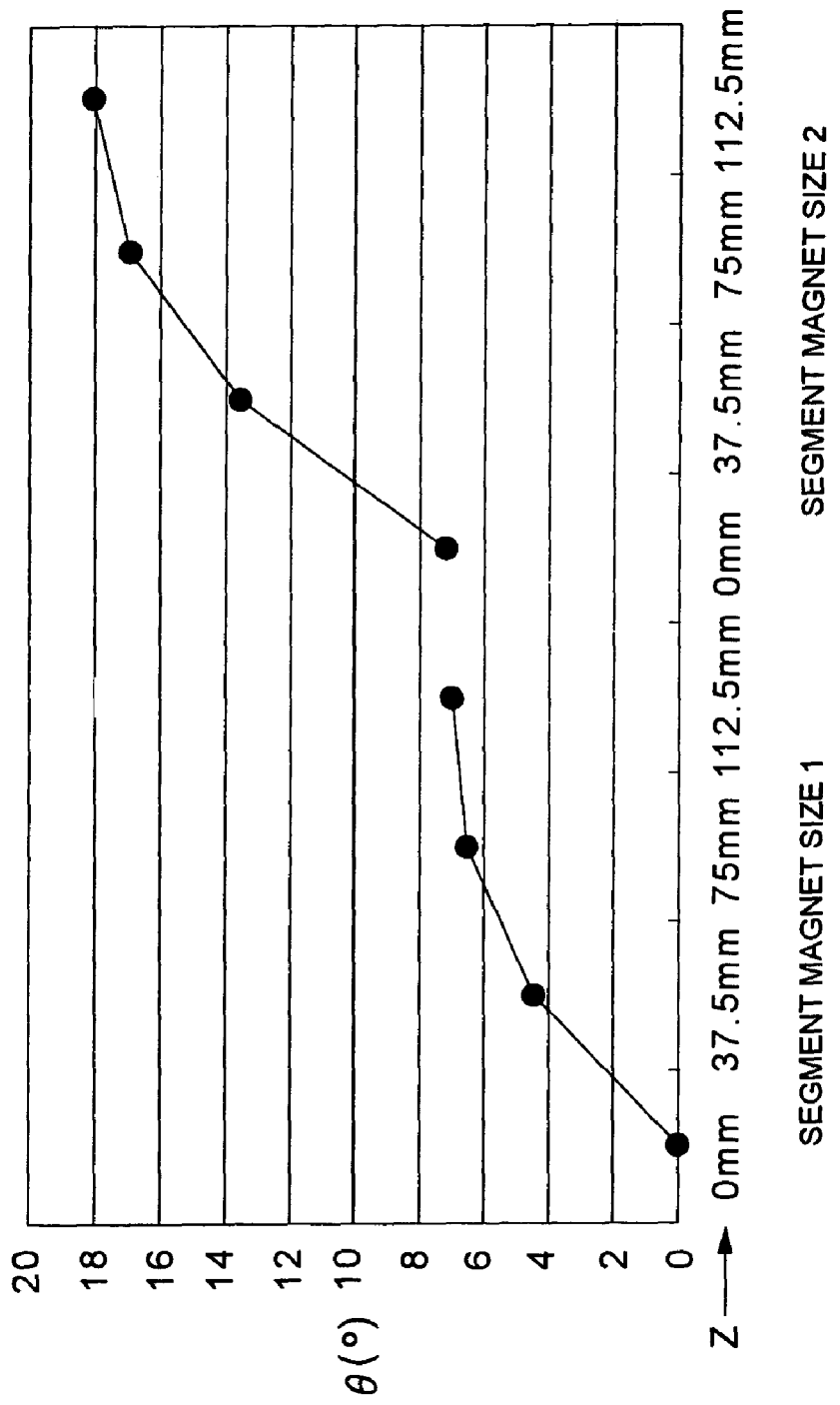
FIG. 21 is a graph showing the changes of the magnetic field angle $\theta$ when displacing upward an upper dipole-ring magnet in the magnetic field generator for magnetron plasma generation according to the embodiment of the fifth invention.

In FIG. 21, the relationship between the upward movement of the upper dipole-ring magnet 88a and the angle θ of the magnetic field, is illustrated as "Segment Magnet Size 1".

According to another experiment conducted by the inventors, the length RL of the dipole-ring magnet was set to 165 mm. Further, each of the anisotropic segment magnets 40 whose number was 16 in total, was an Nd—Fe—B based magnet (Br=1.3 Tesla), having a 60 mm by 60 mm square cross section, and the length of the spacer 91 was 90 mm. The upper dipole-ring magnet 90a had a length ML1 of 52.5 mm, and the lower one 90b had a length of ML2 of 22.5 mm. When the upper dipole-ring magnet 88a is moved upward by 112.5 mm from the initial location thereof shown in FIG. 19, the direction θ (viz., angle of the magnetic field) of the magnetic force line 94 at the end 38a of the wafer in the vicinity of the central cross section C-D of the dipole ring magnet 88 shown in FIG. 19, was able to be changed from about 7° to about 18°.

In FIG. 21, the relationship between the upward movement of the upper dipole-ring magnet 88a and the angle θ of the magnetic field, is illustrated as "Segment Magnet Size 2".

The inventors conducted the experiments so as to check to determine the relationship between the magnetic field angle θ at the wafer edge 38a and the uniformity of etch rate regarding the material to be etched under the above-mentioned process conditions 1 to 4, when the upper dipole-ring magnetic 88a was moved upward and down inside the dipole-ring magnet 35. According to these experiments, the same results as described with reference to FIGS. 4 to 7 were obtained.

Figure 22:
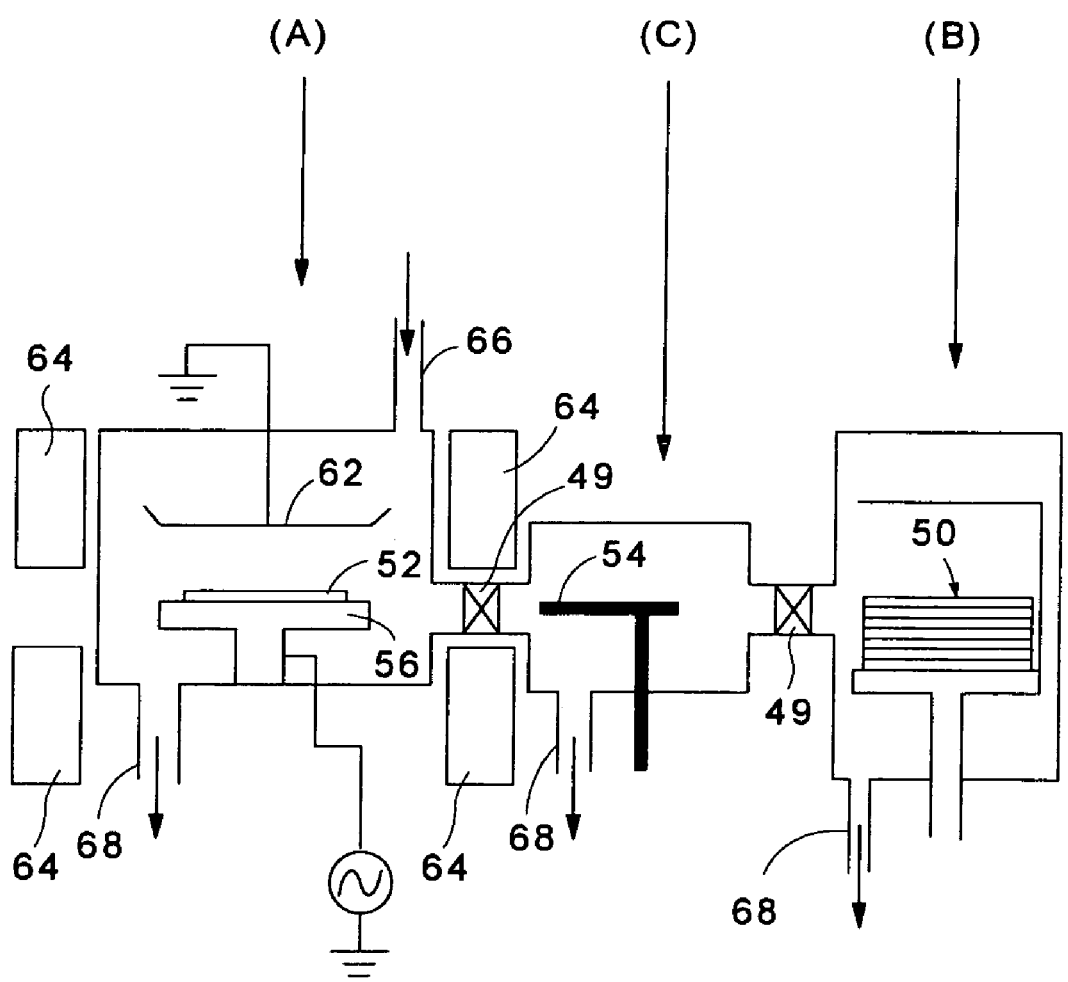
FIG. 22 is a diagram for use in describing the case where the magnetic field generator for magnetron plasma generation according to the embodiment of the fifth invention is applied to a magnetron etching apparatus.

If the fifth invention is applied to the magnetron etching apparatus, an extensive improvement thereof can be expected. That is, as shown in FIG. 22, the space between the dipole-ring magnets 88a and 88b can be used as a part of conduit between the etching chamber (A) and the load lock chamber (C). In other words, a given wafer is taken out from the cassette room (B), and then is transported using the transportation arm 54 into the load lock chamber (C) by way of the above-mentioned space. As a result, it is no longer necessary to provide the lift, and hence the wafer transfer system can be simplified, and in addition thereto, it is possible to overcome the problem resulting from the undesirable generation of dust. Further, the size of the apparatus is able to be reduced with the result of simplifying the apparatus per se.

The sixth invention will be described hereinafter. In brief, the sixth invention features that some of the segment magnets, which constitute part of the conventional dipole-ring magnet shown in FIG. 31, are modified such that the magnetized directions thereof are slanted with respect to the direction perpendicular to the central axis of the dipole-ring magnet (hereinafter, this direction may be referred to as a horizontal direction). According to the magnetic field generator using such a dipole-ring magnet, it is possible, as in the first to fifth inventions, to change the direction of the magnetic field in the vicinity of the central cross section C-D such as to be down-to-up or up-to-down. Accordingly, it is possible to uniform the plasma processing time.

The embodiment of the sixth invention will be described. As mentioned above, the sixth invention differs from the prior art in that some segment magnets among the plurality of segment magnets constituting the magnetic field generator have the magnetized directions differing from the others. Other than this, the sixth invention is identical to the prior art. Therefore, in order to simplify the description, in FIG. 23, a reference numeral 106 denotes the whole dipole-ring magnet, and the upper and lower dipole-ring magnets constituting the dipole-ring magnet 106 are respectively denoted by 108A and 108B. Further, the segment magnets provided in the lower dipole-ring magnet 108B are respectively depicted by 110b (1)-110b (16). The remaining portions are denoted by same reference numerals used in FIG. 31. Besides, when explaining the upper and lower segment magnets on the whole, or when it is not necessary to specify each magnet, the upper and lower segment magnets are generally denoted by 110a and 111b, respectively.

FIG. 23(a) is a top plan view of the upper dipole-ring magnet 106, and FIG. 23(b) is a cross sectional view thereof taken along the line A-B of FIG. 23(a). Although not illustrated, the segment magnets 110b (1)-110b(16) provided in the lower dipole-ring magnets 108B are respectively positioned under the segment magnets 108B-110b (16) provided in the upper dipole-ring magnet 108A. The dipole-ring magnet 106 of FIG. 23, as in the case of FIG. 31, is provided with the non-magnetic spacer 41 between the vertically provided segment magnets, and the segment magnets 110a and 110b are embedded in the non-magnetic base (support) 42. Moreover, the number of the segment magnets 110a and 110b and the configuration thereof are identical to those referred to in FIG. 31.

Still further, as in the prior art, the plant-like electrodes 36 and 37 are provided in parallel with each other inside the dipole-ring magnet 106, and the wafer 38 is mounted on the plate-like electrode 37.

As shown in FIG. 23(b), the segment magnet 110a (5) is magnetized such that the direction of the magnetic field is slanted upward at an angle of about 45° with respect to the direction perpendicular to the central axis of the dipole-ring magnet (this angle is assumed to be positive). On the other hand, the segment magnet 110a (13), which is provided opposite to the magnet 110a(5), is magnetized such that the direction of the magnetic field is slanted downward at an angle of about 45° relative to the direction perpendicular to the central axis of the dipole-ring magnet (this angle is assumed to be negative). In this case, although it is not clear from FIG. 23, the magnetized direction of each of the segment magnets 110a (2)-110a (8) of the left-hand side with respect to the line E-F, is slanted downward at the same angle. Further, the magnetized direction of each of the segment magnets 110a (1) and 110a (9), which is opposite to the direction of the magnetic field 43 generated at the center of the ring of the dipole-ring magnet 106, is horizontal. Still further, in the embodiment shown in FIG. 23, the magnetized directions of the segment magnets 110b of the lower dipole-ring magnet 108B are all perpendicular to the central axis (viz, horizontal) as in the prior art. The magnetized directions of the above-mentioned segment magnets correspond to the case (C) in FIGS. 25 and 26 relating to the relationship between the magnetized direction of the segment magnet and the angle θ of the magnetic field at the wafer edge.

Figure 24:
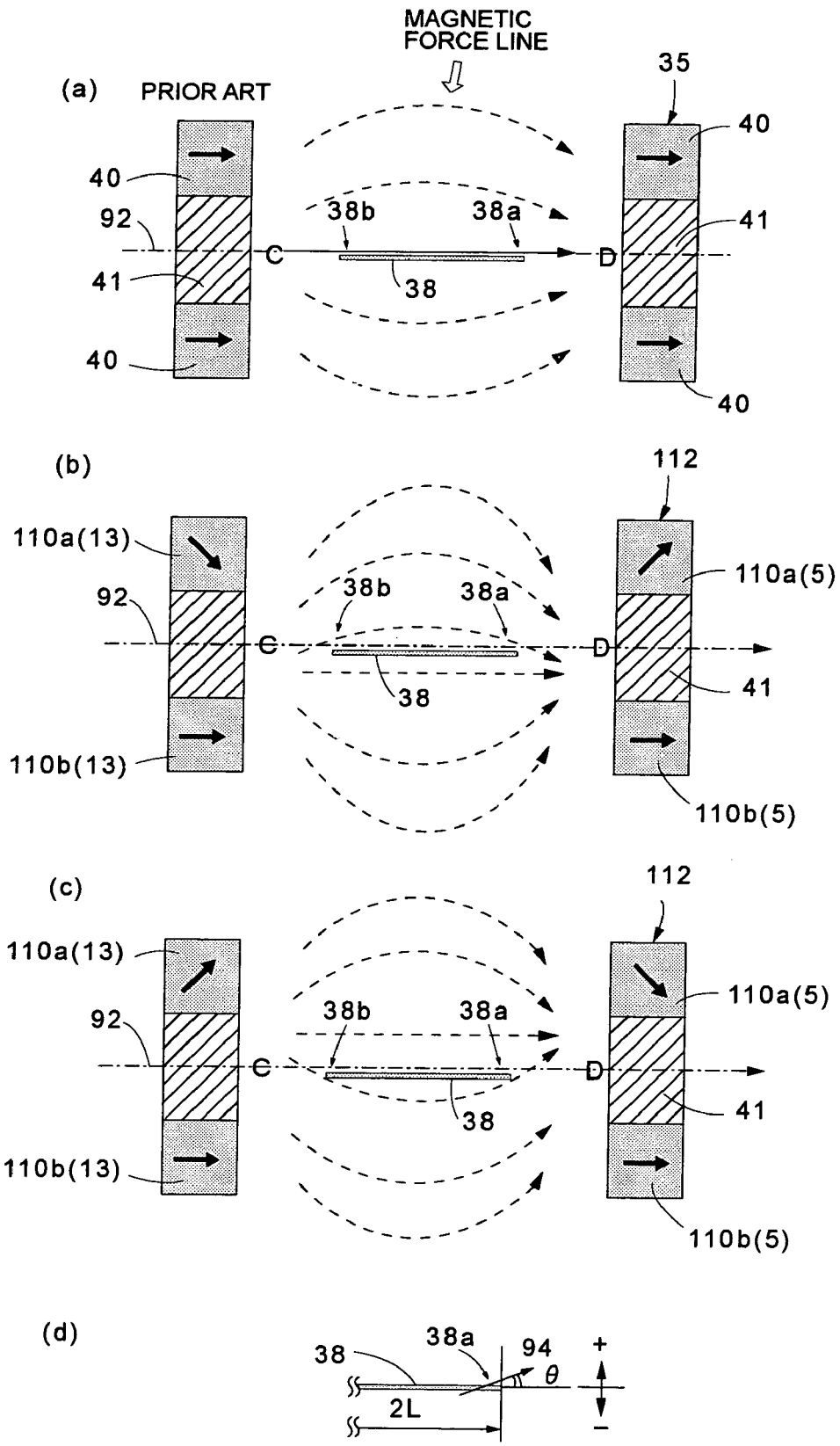
FIG. 24 is a diagram for comparing the lines of magnetic force (magnetic field) generated by the known magnetic field generator for magnetron plasma generation, and the lines of magnetic force (magnetic field) generated by the magnetic field generator for magnetron plasma generation according to the embodiment of the sixth invention shown in FIG. 23.

The fifth invention will further be discussed with reference to FIG. 24. FIG. 24(a), which corresponds to FIG. 3(a), illustrates the magnetic force lines of the dipole-ring magnet in the A-B cross section of the conventional dipole-ring magnet 35 (FIG. 31). The broken line 92, which horizontally (laterally) extends, is in parallel with the central cross section C-D perpendicular to the lengthwise direction of the dipole-ring magnet 35. The line of magnetic force at this portion is substantially horizontal (viz., normal to the central axis). However, the curves of the magnetic force lines become larger as it goes along the central axis of the dipole-ring magnet 35 toward the end thereof.

FIG. 24(b) shows the magnetic force lines in the A-B cross section of the dipole-ring magnet 106 when the segment magnets 110a and 110b have been magnetized as shown in FIG. 23. In this case, the inner poles of the upper segment magnets 110a, each of which has the magnetized direction slanted upward at an angle with respect to the horizontal direction, are lowered. On the other hand, the inner and outer poles of the lower segment magnets 110b remain unchanged. Accordingly, the plane of the horizontal magnetic field of the dipole-ring magnet 106 is lowered, and as such, the direction of the magnetic force line in the vicinity of the central cross section C-D becomes in up-to-down direction.

FIG. 24(c) shows the magnetic force lines in the A-B cross section of the dipole-ring magnet 106 when the magnetized direction of each of the segment magnets 110a(2) to 110a(8) is slanted downward, and when the magnetized direction of each of the segment magnets 10a(10) to 110a(16) is slanted upward, and when all the magnetized directions of the segment magnets 110b are horizontal. In this case, contrary to the case shown in FIG. 24(b), the direction of the magnetic force line near the central cross section C-D becomes in down-to-up direction, which corresponds to the case (F) in FIGS. 25 and 26 relating to the relationship between the magnetized direction of the segment magnet and the angle θ of the magnetic field at the wafer edge.

FIG. 24(d) is a diagram for defining the angle θ of the magnetic force line 94 at the wafer edge 38 as in FIGS. 3, 11, 17, and 20. FIG. 25 schematically shows the angles θ each at the right-hand wafer edge when the magnetized directions of the segment magnets 110a and 110b are changed (denoted by (A) to (I)). When the magnetized directions of one or both of the segment magnets 110a and 110b are slanted at an angle with respect to the horizontal direction, the magnetized direction of each of the segment magnets, which are magnetized in the direction opposite to the direction of the magnetic field 43 generated in the center portion inside the dipole-ring magnet 106, is made horizontal. Further, the magnetized directions of the segment magnets 110a (2)-110a (8) at the right side with respect to the central line E-F are opposite to those of the segment magnets 110a(10)-110a(16) at the left side, and the absolute values of the angles are identical.

FIG. 26 is a table showing the angles θ at the right edge of the wafer 38 together with the magnetized angles of the segment magnets when the magnetized directions of the segment magnets 110a and 110b of FIG. 25 are changed (respectively shown as cases (A)-(I)). The data listed in FIG. 26 were obtained by the experiments conducted by the inventors.

According to the experiments conducted by the inventors, the length RL of the dipole-ring magnet was set to 165 mm. Further, each of the anisotropic segment magnets 110a and 110b whose number was 32 in total, was an Nd—Fe—B based magnet (Br=1.3 Tesla), having a 60 mm by 60 mm square cross section, and the length of the spacer 41 was 90 mm. The magnetized direction of each of the segment magnets 110a(2)-110a(8) was slanted upward at angle of 45°, and the magnetized direction of each of the segment magnets 110a(10)-110a(16) was slanted downward at an angle of 45°, and the magnetized direction of each of the segment magnets 110a(1) and 110a(9) was horizontal. On the other hand, all the magnetized directions of the segment magnets 10b were horizontal. In this case, the angle θ of the magnetic field direction 94 at the wafer edge in the vicinity of the central cross section C-D of the dipole-ring magnet 106 of FIG. 23 was able to be −13.3°. The experimental results obtained by changing the angles of the magnetized directions of the segment magnets 110a and 110b with respect to the horizontal direction are shown as the cases A, B, and D-I in FIG. 26. The case E corresponds to the case shown in FIG. 3(a).

Figure 27:
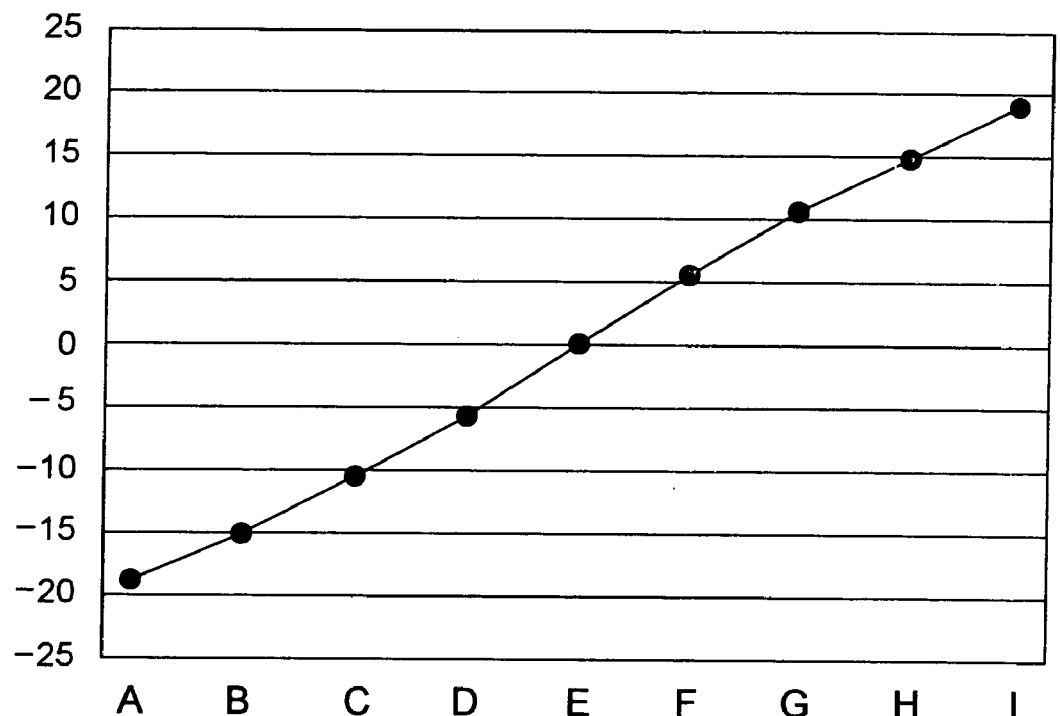
FIG. 27 is a graph showing the relationship shown in FIG. 26.
Figure 30:
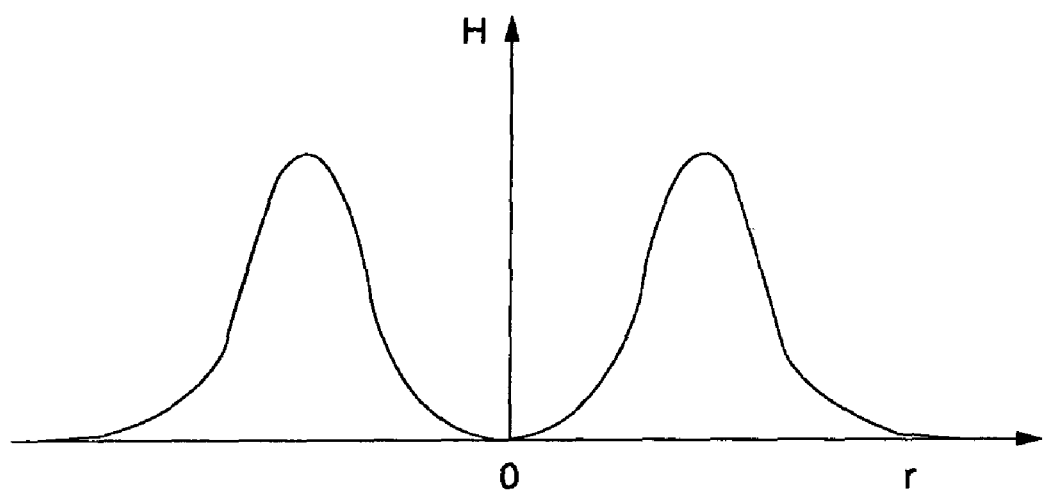
FIG. 30 is a sketch showing the strength of magnetic field in parallel with the wafer surface in relation to the distance from the center of plasma zone toward the circumference in connection with the conventional plasma etching apparatus shown in FIG. 29.

FIG. 27 shows in graph the magnetic field angles θ at the right edge of the wafer, which respectively correspond to the cases A to I of FIG. 26.

The inventors conducted the experiments in connection with the sixth invention so as to check to determine the relationship between the magnetic field angle θ at the wafer edge 38a and the uniformity of etch rate of the material to be etched under the above-mentioned process conditions 1 to 4. According to these experiments, the same results as described with reference to FIGS. 4 to 7 were obtained.

As in the sixth invention, it is possible to additionally provide a mechanism for adjusting the relative vertical location of the wafer 38 and the dipole-ring magnet. With this arrangement, if the results of the preceding etching (such as implemented in trial) is verified, it is possible, at the subsequent etching to realize the better etch uniformity compared with the preceding one. The position adjustment of the wafer 38 can be implemented by moving upward both of the plate-like electrodes 36 and 37 without change of the distance therebetween, or by moving only the plate-like electrode 37. Further, it is possible to move the dipole-ring magnet per se without moving a wafer.

Figure 33:
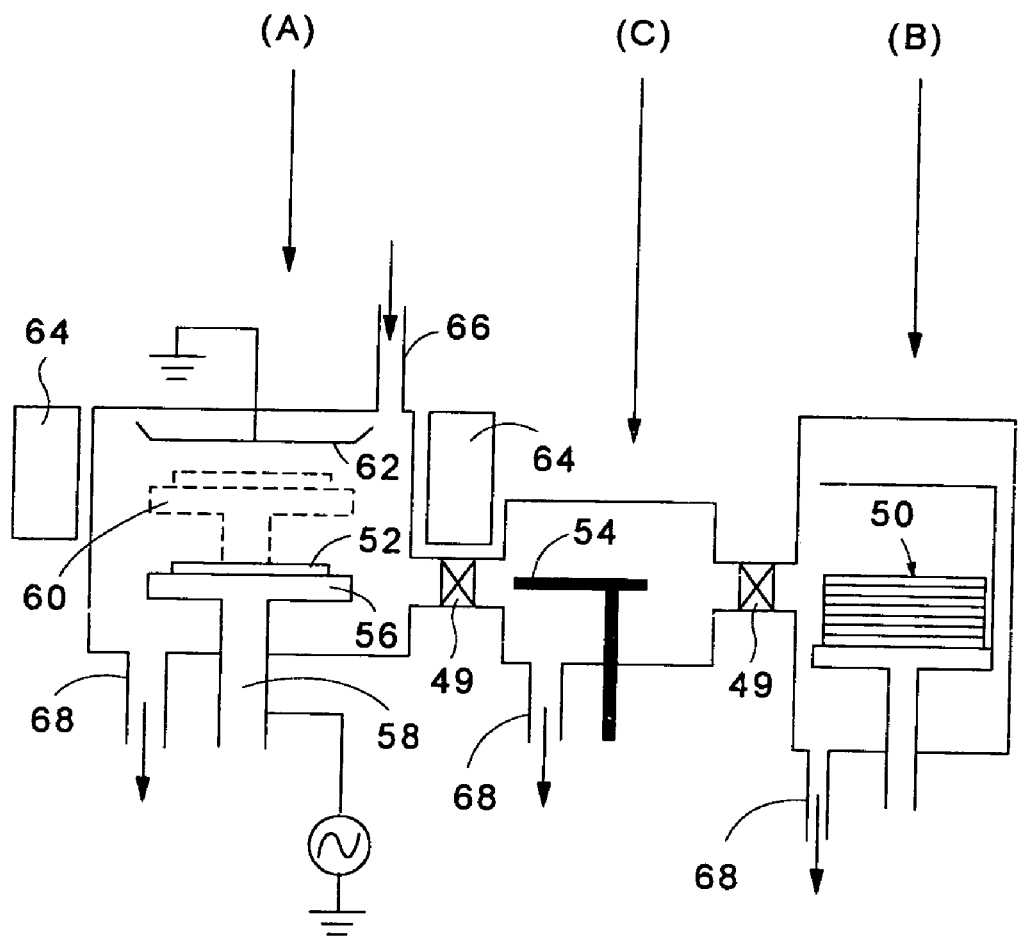
FIG. 33 is a diagram showing the conventional magnetron plasma etching apparatus.

The seventh invention will be described in the following. The seventh invention is characterized by moving the conventional dipole-ring magnet 35 itself shown in FIG. 31 in the vertical direction. The dipole-ring magnet 35 is positioned outside the etching room as shown in FIG. 33, wherein the dipole-ring magnet is denoted by 64. As in the first to sixth inventions, the seventh invention is able to change the magnetic field direction (viz., the angle of magnetic field) in up-to-down or down-to-up direction in the vicinity of the central cross section C-D of the dipole-ring magnet, thereby to be able to adjust the angle of the magnetic field at the edge of the wafer (workpiece) positioned near the central cross section C-D. Therefore, it is possible to achieve the effects of uniforming the etch rate of plasma treatment such as etching implemented on the wafer provided in the vicinity of the central cross section C-D.

In order to ascertain the effects of the seventh invention, the inventors of the present invention conducted experiments so as to determine the uniformity of etching by adjusting the magnetic field angles at the wafer edge by moving the dipole-ring magnet 35 up and down while maintaining the distance between the plantlike electrodes 36 and 37 of FIG. 31. The results of the experiments are shown in FIG. 28(a). Further, in order to evaluate the experimental results of the seventh invention, the following experiment was conducted. That is, the etch uniformity was measured by moving only the plate-like electrode 37 up and down (viz., by changing the distance between the plate-like electrodes 36 and 37) without the movement of the dipole-ring magnet 35. The data obtained by this experiment are shown in FIG. 28(b).

During this experiment, the angle θ of the magnetic field was changed to 5.8°, 8.9°, and 12.0°. The etch rates measured at these angles are respectively shown in FIG. 28 as cases (1), (2), and (3). The etch rate was determined as follows. The film thicknesses before and after the etching were measured at a plurality of points on the wafer surface within the region except for the width of 3 mm from the wafer circumference and along two perpendicular lines in the direction of diameter. Subsequently, the difference between the film thicknesses measured before and after the etching was divided by the etching time. A silicon oxide film was used as an etched material. In the following, a process condition (5) is concerned with the seventh invention, and a process condition (6) is for evaluating the effects of the seventh invention.

[Process Condition 5]
Wafer diameter 200 mm
Frequency of high frequency power supply: 13.56 MHz
Electric power of high frequency power supply: 1500 W
Gap between electrodes: 27 mm
Magnetic field strength at the center portion of the wafer: about 120 Gauss
Etched film: silicon oxide film, Etching Gas:
$C_4F_8/CO/Ar/O_2$=10/50/200/5 sccm
Chamber internal pressure: 45 mTorr, Susceptor temperature: 40° C.

[Process Condition 6]
Wafer diameter: 200 mm
Frequency of high frequency power supply: 13.56 MHz
Electric power of high frequency power supply: 1500 W
Gap between electrodes:
 (1) 27 mm when the magnetic field angle θ was 5.8°
 (2) 37 mm when the magnetic field angle θ was 8.9°
 (3) 47 mm when the magnetic field angle θ was 12.0°
Magnetic field strength at the center portion of the wafer: about 120 Gauss
Etched film: silicon oxide film
Etching Gas: $C_4F_8/CO/Ar/O_2$=10/50/200/5 sccm
Chamber internal pressure: 45 mTorr
Susceptor temperature: 40° C.

It will be understood, from FIGS. 28(a) and 28(b), that according to the seventh invention, the etch uniformity was able to be improved as compared with the case presented for the evaluation.

In order to improve the etch uniformity using the present inventions, when a given etching is completed, etch rates at the end and center of the workpiece (wafer) are measured. Following this, on the basis of the measurement results, if it is desired to decrease the etch rate at the workpiece edge relative to that at the center, the angle of the magnetic field at the workpiece edge is increased compared with the angle obtained at the preceding measurement, and the subsequent etching is implemented. On the contrary, on the basis of the measurement results, if it is desired to increase the etch rate at the workpiece edge relative to that at the center, the angle of the magnetic field at the workpiece edge is decreased compared with the angle obtained at the preceding measurement, and the subsequent etching is implemented. Thus, if the etching is carried out based on the etch profile obtained at the preceding one, it is possible to implement etching with good etch uniformity.

AVAILABILITY IN INDUSTRY

The present inventions thus far described relates to a magnetic field generator for magnetron plasma generation, and also to a plasma etching apparatus and method utilizing such a magnetic field generator. The apparatus and the method according to the present inventions are well suited for use in etching implemented in production processes of electronic components such as semiconductor devices. The present inventions are further applicable to a semiconductor processing apparatus and method of plasma treatment such as sputtering.

The invention claimed is:

1. A magnetic field generator for magnetron plasma generation comprising a first dipole-ring magnet having a plurality of columnar first segment magnets arranged in a ring-like manner and a second dipole-ring magnet having a plurality of columnar second segment magnets arranged in a ring-like manner, wherein the plurality of first and second segment magnets are embedded in a non-magnetic base and are respectively equipped with a spacer, wherein the first dipole-ring magnet is identical in diameter with the second dipole-ring magnet, and the first dipole-ring magnet is arranged such as to be superimposed on the second dipole-ring magnet, and the first segment magnets, provided on one side of the spacer are different in length from the second segment magnets provided on the opposite side of the spacer in the direction of central axis thereof.

2. The magnetic field generator as claimed in claim 1, wherein at least one of the first and second dipole-ring magnets is movable in the direction of the central axis of the dipole-ring magnet.

3. A magnetic field generator for magnetron plasma generation comprising a first dipole-ring magnet having a plurality of columnar first segment magnets arranged in a ring-like manner and a second dipole-ring magnet having a plurality of columnar second segment magnets arranged in a ring-like manner, wherein the plurality of first and second segment magnets are embedded in a non-magnetic base and are respectively equipped with a spacer, wherein the first dipole-ring magnet is identical in diameter with the second dipole-ring magnet, and the first dipole-ring magnet is arranged such as to be superimposed on the second dipole-ring magnet, and the first segment magnets provided on one side of the spacer and second segment magnets provided on the opposite side of the spacer are different in the magnetic field strength thereof and have different magnetic flux densities.

4. The magnetic field generator as claimed in claim 3, characterized in that at least one of the first and second dipole-ring magnets is movable in the direction of the central axis of the dipole-ring magnet.

5. A magnetic field generator for magnetron plasma generation comprising a dipole-ring magnet with a plurality of columnar segment magnets arranged in a ring-like manner with the magnetization directions thereof varying continuously around the ring, wherein the generator is provided with at least one magnetic field direction control means, and wherein the magnetic field direction control means is a disk-like magnet which is magnetized such as to have two poles on each major side thereof and positioned such that the major side thereof is in a plane normal to the center axis of the dipole-ring magnet, and the disk-like magnet is away from a horizontal level at which a workpiece is provided, and is positioned in the vicinity of an upper end of the dipole-ring magnet.

6. The magnetic field generator as claimed in claim 5, wherein the disk-like magnet is divided into two halves along a plane that includes the central axis of the disk-like magnet, one half of the disk-like magnet is magnetized in a first direction and the other half thereof is magnetized in a second direction opposite to the first direction, and wherein the line along which the disk-like magnet is divided is substantially normal to the direction of the magnetic field of the dipole-ring magnet.

7. The magnetic field generator as claimed in claim 5, wherein the magnetic field direction control means is movable in the direction of the central axis of the dipole-ring magnet.

8. The magnetic field generator as claimed in claim 5, wherein the disk-like magnet is rotatable around the central axis of the dipole-ring magnet.

9. A magnetic field generator for magnetron plasma generation comprising a dipole-ring magnet with a plurality of columnar segment magnets arranged in a ring-like manner, wherein the generator is provided with at least one magnetic field direction control means for controlling the direction of the magnetic field of the dipole-ring magnet in the direction of the central axis of the dipole-ring magnet, and wherein the magnetic field direction control means is a ring-like member of magnetic substance and is moveable in the direction of the central axis of the dipole-ring magnet, and the ring-like member is provided in the vicinity of inner surface of the dipole-ring magnet.

10. A magnetic field generator for magnetron plasma generation comprising a dipole-ring magnet with a plurality of columnar segment magnets arranged in a ring-like manner, wherein the generator is provided with at least one magnetic field direction control means for controlling the direction of the magnetic field of the dipole-ring magnet, and the magnetic field direction control means is a ring-like magnet which is magnetized such as to have two poles, and the ring-like magnet is away from a horizontal level, at which a workpiece is provided, and is positioned in the vicinity of an upper end of the dipole-ring magnet, and wherein the ring-like magnet is divided into two halves along a plane that includes the central axis of the ring-like magnet, one half of the ring-like magnet is magnitized in a first direction and the other half thereof is magnitized in a second direction opposite to the first direction, and wherein the line along which the ring-like magnet is divided substantially normal to the direction of the magnetic field of the dipole-ring magnet.

11. A magnetic field generator for magnetron plasma generation comprising a dipole-ring magnet with a plurality of columnar segment magnets arranged in a ring-like manner, wherein the generator is provided with at least one magnetic field direction control means for controlling the direction of the magnetc field of the dipole-ring magnet in the direction of the central axis of the dipole-ring magnet, the magnetic field direction control means is a ring-like member of magnetic substance and is moveable in the direction of the central axis of the dipole-ring magnet, and wherein the magnetic ring-like member is positioned between an inner surface of the dipole-ring magnet and a processing chamber provided inside of the dipole-ring magnet.

* * * * *